(12) United States Patent
Takahashi et al.

(10) Patent No.: US 11,948,959 B2
(45) Date of Patent: Apr. 2, 2024

(54) IMAGING DEVICE COMPRISING FIRST CIRCUIT AND SECOND CIRCUIT

(71) Applicant: Semiconductor Energy Laboratory Co., Ltd., Atsugi (JP)

(72) Inventors: Kei Takahashi, Isehara (JP); Naoto Kusumoto, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 587 days.

(21) Appl. No.: 17/258,805

(22) PCT Filed: Jul. 18, 2019

(86) PCT No.: PCT/IB2019/056134
§ 371 (c)(1),
(2) Date: Jan. 8, 2021

(87) PCT Pub. No.: WO2020/021398
PCT Pub. Date: Jan. 30, 2020

(65) Prior Publication Data
US 2021/0273007 A1    Sep. 2, 2021

(30) Foreign Application Priority Data
Jul. 27, 2018  (JP) ................. 2018-141605

(51) Int. Cl.
*H01L 27/146*   (2006.01)
*H01L 31/107*   (2006.01)
*H04N 25/77*    (2023.01)

(52) U.S. Cl.
CPC ...... *H01L 27/14636* (2013.01); *H01L 31/107* (2013.01); *H04N 25/77* (2023.01)

(58) Field of Classification Search
CPC ............ H01L 27/14636; H01L 31/107; H04N 25/77
(Continued)

(56) References Cited

U.S. PATENT DOCUMENTS

| 8,378,391 B2 | 2/2013 | Koyama et al. |
| 8,860,108 B2 | 10/2014 | Yamazaki et al. |
| 8,916,869 B2 | 12/2014 | Koyama et al. |

(Continued)

FOREIGN PATENT DOCUMENTS

| CN | 102598249 A | 7/2012 |
| CN | 102598269 A | 7/2012 |

(Continued)

OTHER PUBLICATIONS

International Search Report (Application No. PCT/IB2019/056134) dated Oct. 15, 2019.
(Continued)

*Primary Examiner* — Nduka E Ojeh
(74) *Attorney, Agent, or Firm* — Eric J. Robinson; Robinson Intellectual Property Law Office, P.C.

(57) ABSTRACT

An imaging device that generates, in a pixel, a potential higher than a potential to be supplied to the pixel is provided. The imaging device includes a pixel including a first circuit and a second circuit; the second circuit includes a photoelectric conversion device; the first circuit is electrically connected to the second circuit; the first circuit has a function of adding a first potential and a second potential to generate a third potential; and the second circuit has a function of generating data in the photoelectric conversion device to which the third potential is applied and has a function of outputting the data.

13 Claims, 22 Drawing Sheets

(58) Field of Classification Search
USPC .......................................................... 257/43
See application file for complete search history.

(56) References Cited

U.S. PATENT DOCUMENTS

| | | | |
|---|---|---|---|
| 9,331,112 | B2 | 5/2016 | Koyama et al. |
| 9,773,814 | B2 | 9/2017 | Koyama et al. |
| 10,498,980 | B2 | 12/2019 | Ohmaru |
| 2011/0101334 | A1 | 5/2011 | Yamazaki et al. |
| 2011/0108836 | A1 | 5/2011 | Koyama et al. |
| 2013/0292671 | A1 | 11/2013 | Yamazaki et al. |
| 2016/0190188 | A1* | 6/2016 | Murakami ........ H01L 27/14609 250/214 A |
| 2017/0013214 | A1* | 1/2017 | Ohmaru ............... H04N 25/583 |
| 2017/0041517 | A1* | 2/2017 | Ikeda .................. H01L 27/1225 |

FOREIGN PATENT DOCUMENTS

| | | |
|---|---|---|
| EP | 3051588 A | 8/2016 |
| JP | 2011-119674 A | 6/2011 |
| JP | 2011-119711 A | 6/2011 |
| JP | 2017-022706 A | 1/2017 |
| KR | 2012-0091237 A | 8/2012 |
| KR | 2012-0091294 A | 8/2012 |
| WO | WO-2011/052367 | 5/2011 |
| WO | WO-2011/055626 | 5/2011 |

OTHER PUBLICATIONS

Written Opinion (Application No. PCT/IB2019/056134) dated Oct. 15, 2019.

\* cited by examiner

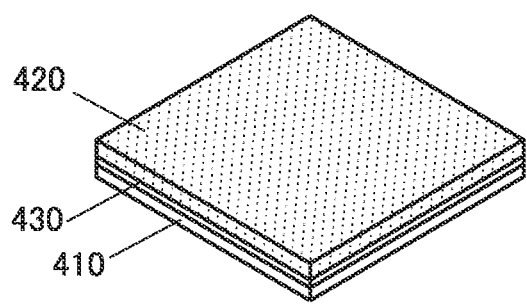
FIG. 21A1
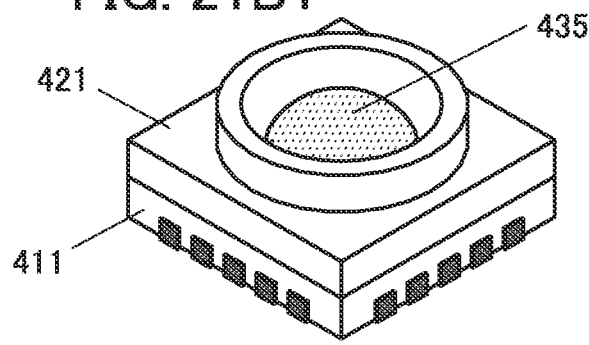
FIG. 21B1
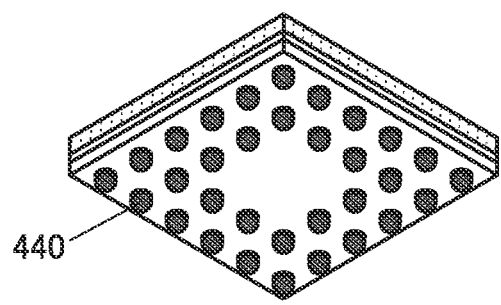
FIG. 21A2
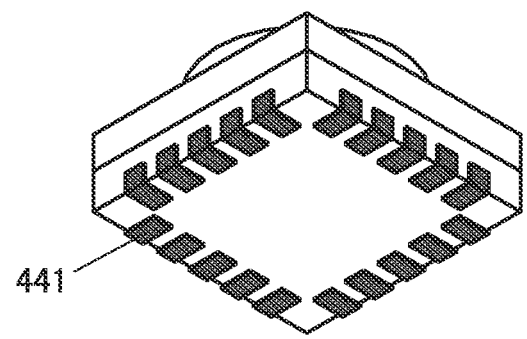
FIG. 21B2
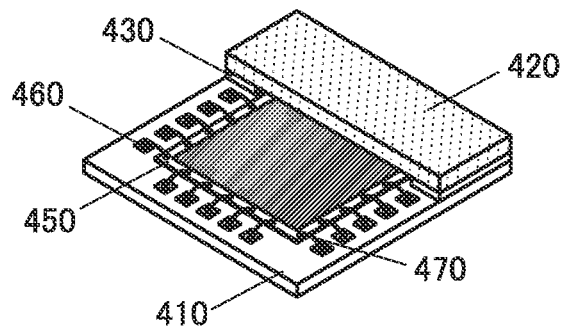
FIG. 21A3
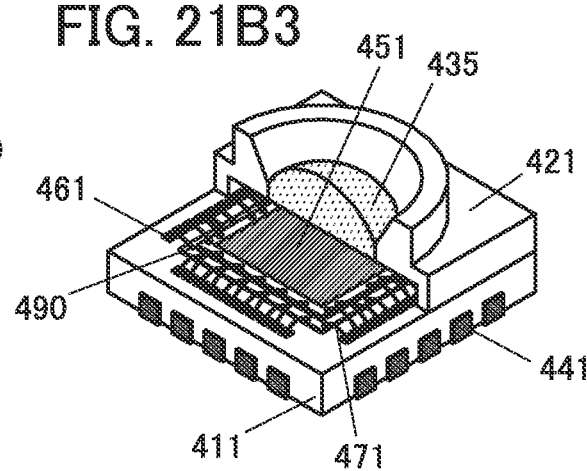
FIG. 21B3

IMAGING DEVICE COMPRISING FIRST CIRCUIT AND SECOND CIRCUIT

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Thus, more specifically, a semiconductor device, a display device, a liquid crystal display device, a light-emitting device, a lighting device, a power storage device, a memory device, an imaging device, a driving method thereof, or a manufacturing method thereof can be given as an example of the technical field of one embodiment of the present invention disclosed in this specification.

Note that in this specification and the like, a semiconductor device refers to all devices that can function by utilizing semiconductor characteristics. A transistor and a semiconductor circuit are embodiments of semiconductor devices. Furthermore, in some cases, a memory device, a display device, an imaging device, or an electronic device includes a semiconductor device.

BACKGROUND ART

A technique for forming a transistor by using an oxide semiconductor thin film formed over a substrate has attracted attention. For example, an imaging device with a structure in which a transistor including an oxide semiconductor and having an extremely low off-state current is used in a pixel circuit is disclosed in Patent Document 1.

Patent Document 2 discloses a memory device using a transistor with an extremely low off-state current in a memory cell.

REFERENCES

Patent Documents

[Patent Document 1] Japanese Published Patent Application No. 2011-119711
[Patent Document 2] Japanese Published Patent Application No. 2011-119674

SUMMARY OF THE INVENTION

Problems to be Solved by the Invention

To increase the resolution of an image sensor requires a reduction in the area of each pixel and an increase in pixel density. When the pixel area is reduced, the area of a light-receiving portion of a photoelectric conversion device is also reduced; as a result, the photosensitivity is lowered. In particular, in image capturing under low illuminance, the S/N ratio of imaging data largely decreases in some cases. That is, an image sensor with a conventional structure has a problem in that resolution and photosensitivity have a trade-off relationship.

A solution to the above problem is to use a photoelectric conversion device utilizing an avalanche multiplication effect, which has high photosensitivity. Note that to utilize an avalanche multiplication effect requires application of a relatively high voltage to a photoelectric conversion device; thus, a dedicated power supply circuit or the like needs to be used.

Thus, an object of one embodiment of the present invention is to provide an imaging device capable of generating a voltage higher than a voltage to be supplied to a pixel. Another object is to provide an imaging device capable of adding two potentials to be supplied to a pixel. Another object is to provide an imaging device capable of generating a reset potential in a pixel.

Another object is to provide an imaging device with low power consumption. Another object is to provide an imaging device capable of capturing an image at high speed. Another object is to provide an imaging device with high reliability. Another object is to provide a novel imaging device. Another object is to provide a method for operating the above imaging device. Another object is to provide a novel semiconductor device or the like.

Note that the description of these objects does not disturb the existence of other objects. One embodiment of the present invention does not need to achieve all the objects. Objects other than these will be apparent from the description of the specification, the drawings, the claims, and the like, and objects other than these can be derived from the description of the specification, the drawings, the claims, and the like.

Means for Solving the Problems

One embodiment of the present invention relates to an imaging device that generates, in a pixel, a potential higher than a potential to be supplied to the pixel.

One embodiment of the present invention is an imaging device including a pixel including a first circuit and a second circuit, the second circuit includes a photoelectric conversion device, the first circuit is electrically connected to the second circuit, the first circuit has a function of adding a first potential and a second potential to generate a third potential, and the second circuit has a function of generating data in the photoelectric conversion device to which the third potential is applied and a function of outputting the data.

The first circuit can include a first transistor, a second transistor, and a first capacitor, one of a source and a drain of the first transistor can be electrically connected to one electrode of the first capacitor, the other electrode of the first capacitor can be electrically connected to one of a source and a drain of the second transistor, and the one of the source and the drain of the first transistor can be connected to the second circuit.

The second circuit can further include a third transistor, a fourth transistor, a fifth transistor, and a second capacitor, one electrode of the photoelectric conversion device can be electrically connected to one of a source and a drain of the third transistor, the other of the source and the drain of the third transistor can be electrically connected to one electrode of the second capacitor, the one electrode of the second capacitor can be electrically connected to a gate of the fourth transistor, and one of a source and a drain of the fourth transistor can be electrically connected to one of a source and a drain of the fifth transistor.

The one of the source and the drain of the third transistor in the second circuit can be connected to the first circuit. Alternatively, the other of the source and the drain of the third transistor in the second circuit can be connected to the first circuit.

As a structure different from the above, the second circuit may further include a third transistor, a fourth transistor, a fifth transistor, and a second capacitor, one electrode of the photoelectric conversion device may be electrically connected to one electrode of the second capacitor, the other electrode of the second capacitor may be electrically connected to a gate of the fourth transistor, one of a source and a drain of the fourth transistor may be electrically connected to one of a source and a drain of the fifth transistor, the other electrode of the photoelectric conversion device may be electrically connected to one of a source and a drain of the third transistor, and the one electrode of the photoelectric conversion device may be connected to the first circuit.

It is preferable that at least one of the transistors in the imaging device include a metal oxide in a channel formation region, and the metal oxide contain In, Zn, and M (M is Al, Ti, Ga, Sn, Y, Zr, La, Ce, Nd, or Hf).

An avalanche photodiode is preferably used as the photoelectric conversion device.

Effect of the Invention

With the use of one embodiment of the present invention, an imaging device capable of generating a voltage higher than a voltage to be supplied to a pixel can be provided. Alternatively, an imaging device capable of adding two potentials to be supplied to a pixel can be provided. Alternatively, an imaging device capable of generating a reset potential in a pixel can be provided.

An imaging device with low power consumption can be provided. An imaging device capable of capturing an image at high speed can be provided. An imaging device with high reliability can be provided. A novel imaging device can be provided. A method for operating the above imaging device can be provided. A novel semiconductor device or the like can be provided.

BRIEF DESCRIPTION OF THE DRAWINGS

FIGS. 21(A1) to 21(B3) are perspective views of a package and a module in each of which an imaging device is placed.

MODE FOR CARRYING OUT THE INVENTION

Figure 1:
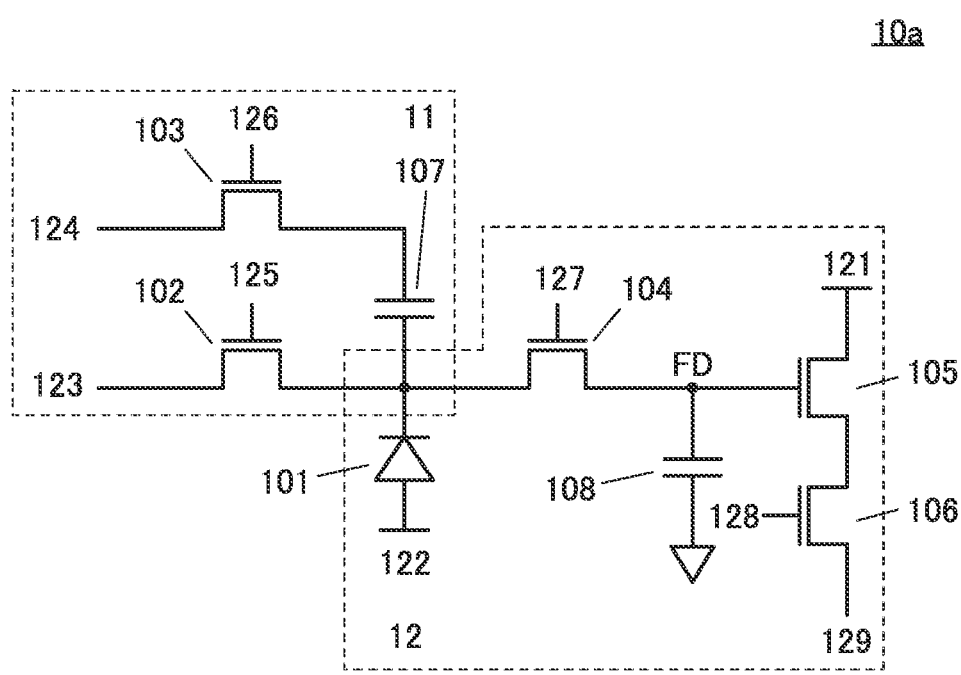
FIG. 1 is a diagram illustrating a pixel circuit.

Embodiments will be described in detail with reference to drawings. Note that the present invention is not limited to the following description, and it will be easily understood by those skilled in the art that the modes and details can be modified in various ways without departing from the spirit and the scope of the present invention. Therefore, the present invention should not be interpreted as being limited to the description of the following embodiments. Note that in structures of the invention described below, the same reference numerals are commonly used, in different drawings, for the same portions or portions having similar functions, and description thereof is not repeated in some cases. Note that the hatching of the same component that constitutes a drawing is omitted or changed as appropriate in different drawings in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where components are illustrated in a circuit diagram as if they were directly connected to each other, the components may actually be connected to each other through a plurality of conductors; in this specification, even such a structure is included in direct connection.

Embodiment 1

In this embodiment, an imaging device of one embodiment of the present invention is described with reference to drawings.

One embodiment of the present invention is an imaging device capable of performing boosting operation in a pixel. Generation of a high voltage in a pixel enables an avalanche photodiode to be operated without the use of a high voltage power source. Thus, an imaging device with low power consumption and high sensitivity can be provided.

Structure Example 1

FIG. 1 is a diagram illustrating a pixel 10a that can be used for an imaging device of one embodiment of the present invention. The pixel 10a can include a circuit 11 and a circuit 12.

The circuit 11 is a circuit that generates a reset potential, and can generate a high voltage by addition of two supplied potentials.

The circuit 12 includes a photoelectric conversion device, can operate the photoelectric conversion device with the use of the reset potential generated in the circuit 11, and can generate and retain image data.

An avalanche photodiode is preferably used as the photoelectric conversion device. Since a high voltage (reset potential) can be generated in the circuit 11, the avalanche photodiode can be operated without the use of a high voltage power source.

The circuit 11 can include a transistor 102, a transistor 103, and a capacitor 107. One of a source and a drain of the transistor 102 is electrically connected to one electrode of the capacitor 107. The other electrode of the capacitor 107 is electrically connected to one of a source and a drain of the transistor 103. The one of the source and the drain of the transistor 102 can be connected to the circuit 12.

The circuit 12 can include a photoelectric conversion device 101, a transistor 104, a transistor 105, a transistor 106, and a capacitor 108. Note that a structure without the capacitor 108 may be employed.

One electrode (cathode) of the photoelectric conversion device 101 is electrically connected to one of a source and a drain of the transistor 104. The other of the source and the drain of the transistor 104 is electrically connected to one electrode of the capacitor 108. The one electrode of the capacitor 108 is electrically connected to a gate of the transistor 105. One of a source and a drain of the transistor 105 is electrically connected to one of a source and a drain of the transistor 106. The one of the source and the drain of the transistor 104 can be electrically connected to the circuit 11.

Here, a wiring that connects the other of the source and the drain of the transistor 104, the one electrode of the capacitor 108, and the gate of the transistor 105 is a node FD. The node FD can function as a charge accumulation portion.

The other electrode (anode) of the photoelectric conversion device 101 is electrically connected to a wiring 122. A gate of the transistor 102 is electrically connected to a wiring 125. The other of the source and the drain of the transistor 102 is electrically connected to a wiring 123. A gate of the transistor 103 is electrically connected to a wiring 126. The other of the source and the drain of the transistor 103 is electrically connected to a wiring 124. A gate of the transistor 104 is electrically connected to a wiring 127. The other electrode of the capacitor 108 is electrically connected to a reference potential line such as a GND wiring, for example. The other of the source and the drain of the transistor 105 is electrically connected to a wiring 121. A gate of the transistor 106 is electrically connected to a wiring 128. The other of the source and the drain of the transistor 106 is electrically connected to a wiring 129.

The wirings 121 and 122 can each have a function of a power supply line. The wirings 123 and 124 can each have a function of supplying a potential for generating a reset potential. The potentials of the wirings 123 and 124 change depending on the connection direction of the photoelectric conversion device 101. The structure illustrated in FIG. 1 is a structure in which the cathode side of the photoelectric conversion device 101 is electrically connected to the transistor 102 and the node FD is reset to a high potential in the operation; accordingly, the wirings 123 and 124 are each set at a high potential (a potential higher than that of the wiring 122). When the connection direction of the photoelectric conversion device 101 is opposite to that in FIG. 1, the wirings 123 and 124 are each set at a low potential (a potential lower than that of the wiring 122).

The wirings 125, 126, 127, and 128 can function as signal lines that control the conduction of the respective transistors. The wiring 129 can function as an output line.

As the photoelectric conversion device 101, a photodiode can be used. In one embodiment of the present invention, an avalanche photodiode is preferably used.

The transistors 102 and 103 each have a function of generating a reset potential. The transistor 104 has a function of controlling the potential of the node FD. The transistor 105 functions as a source follower circuit, and can output the potential of the node FD as image data to the wiring 129. The transistor 106 has a function of selecting a pixel to which the image data is output.

In the case where an avalanche photodiode is used as the photoelectric conversion device 101, a relatively high voltage is applied and thus a transistor with a high withstand voltage is preferably used as a transistor connected to the photoelectric conversion device 101. As the transistor with a high withstand voltage, a transistor using a metal oxide in a channel formation region (hereinafter, an OS transistor) or the like can be used, for example. Specifically, OS transistors are preferably used as the transistors 102 and 104, for example. OS transistors may also be used as the transistors 103, 105, and 106.

The OS transistor also has a feature of an extremely low off-state current. When OS transistors are used as the transistors 102 and 104, a period during which charge can be retained at the node FD can be elongated greatly. Therefore, a global shutter system in which charge accumulation operation is performed in all the pixels at the same time can be used without complicating the circuit structure and operation method.

Note that without limitation to the above, an OS transistor and a transistor in which Si is used in a channel formation region (hereinafter, a Si transistor) may be freely used in combination. Furthermore, all the transistors may be either OS transistors or Si transistors. Examples of the Si transistor include a transistor containing amorphous silicon and a transistor containing crystalline silicon (typically, low-temperature polysilicon, single crystal silicon, or the like).

Structure Example 2

Figure 2:
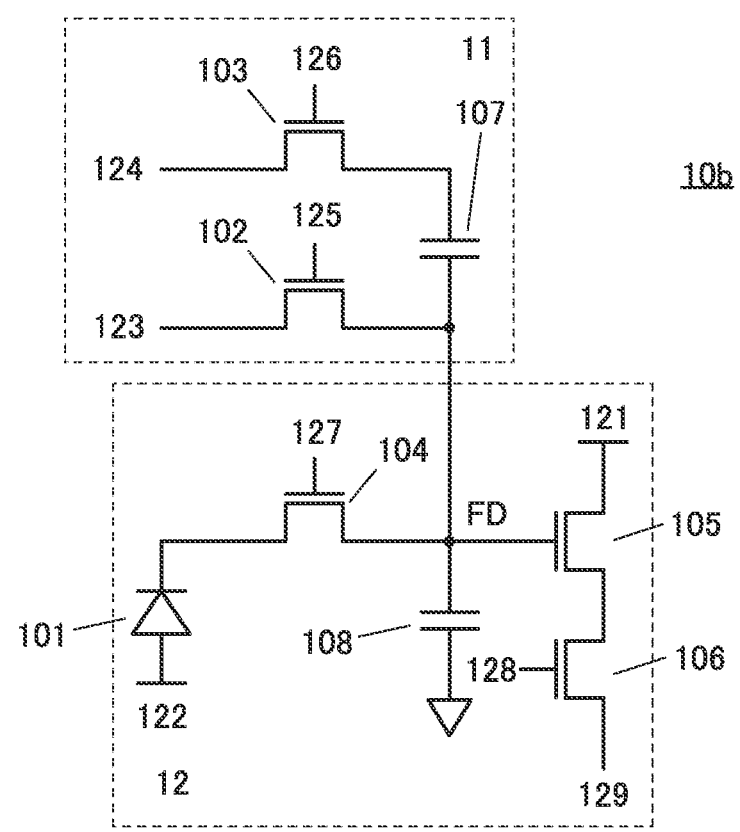
FIG. 2 is a diagram illustrating a pixel circuit.

The imaging device of one embodiment of the present invention may employ a structure of a pixel 10b illustrated in FIG. 2. In this structure, a position of connection between the circuit 11 and the circuit 12 is different from that in the pixel 10a; the circuit 11 is connected to the node FD. In this structure, a wiring that connects the other of the source and the drain of the transistor 104, the one electrode of the capacitor 108, the gate of the transistor 105, the one of the source and the drain of the transistor 102, and the one electrode of the capacitor 107 is the node FD. The structures of the circuit 11, the circuit 12, and the wirings connected to them are the same as those in the pixel 10a.

Structure Example 3

Figure 3:
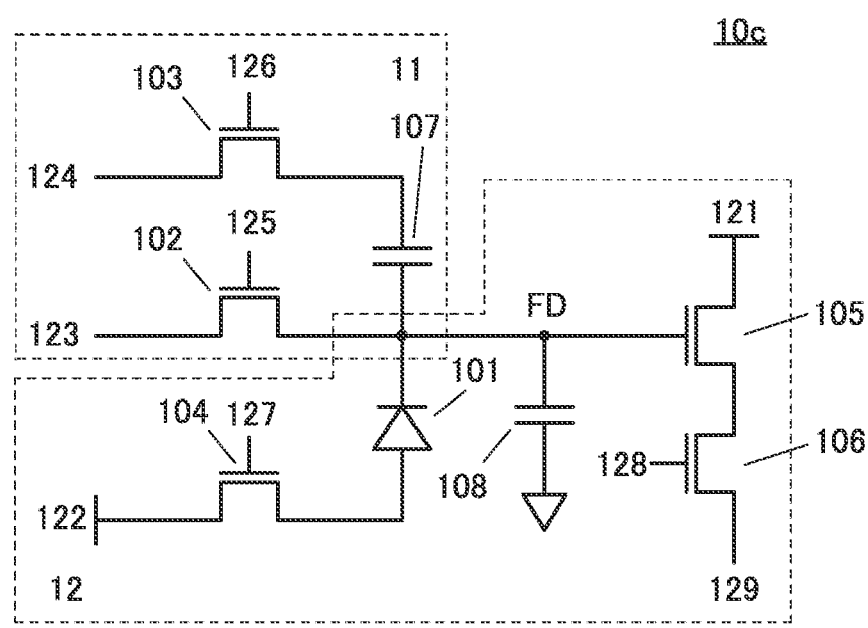
FIG. 3 is a diagram illustrating a pixel circuit.

The imaging device of one embodiment of the present invention may employ a structure of a pixel 10c illustrated in FIG. 3. In this structure, a connection position of the transistor 104 in the circuit 12 is different from that in the pixel 10a illustrated in FIG. 1. One of the source and the drain of the transistor 104 is electrically connected to the other electrode (anode) of the photoelectric conversion device 101, and the other of the source and the drain of the transistor 104 is electrically connected to the wiring 122. The other structures are the same as those of the pixel 10a.

In this structure, the node FD is a wiring that connects the one of the source and the drain of the transistor 102, the one electrode of the capacitor 107, the one electrode of the capacitor 108, the gate of the transistor 105, and the one electrode (cathode) of the photoelectric conversion device 101. Note that the potential of the node FD is determined in consideration of a potential distributed to the other electrode (anode) of the photoelectric conversion device 101.

The transistor 104 has a function of controlling the potential of the node FD. Specifically, the transistor 104 is used for operation of initialization and retention of the potential of the node FD. In the pixel 10a, the operation for determining the potential of the node FD is performed by turning off the transistor 104 to block the conduction between the photoelectric conversion device 101 and the node FD.

In the pixel 10c, the transistor 104 is turned off to block the conduction between the other electrode (anode) of the photoelectric conversion device 101 and the wiring 122. When the transistor 104 is turned off, the potential of the anode of the photoelectric conversion device 101 increases and the potential difference between the cathode and the anode comes close to a forward voltage (Vf); thus, the operation of the photoelectric conversion device 101 is stopped. Therefore, the potential of the node FD can be determined.

Modification Example of Circuit 12

The above-described pixels 10a, 10b, and 10c each have a structure in which the reset potential of the node FD is set to a voltage higher than that of the anode of the photoelectric conversion device 101 and the photoelectric conversion device 101 is connected in the direction in which a reverse bias is applied.

Figure 4A:
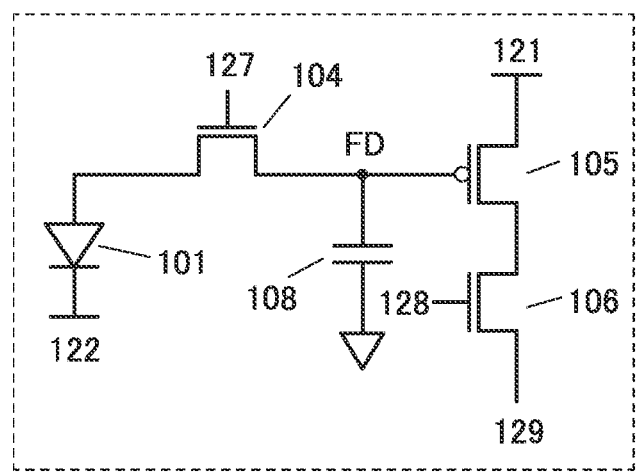
FIGS. 4(A) and 4(B) are diagrams each illustrating a pixel circuit.
Figure 4B:
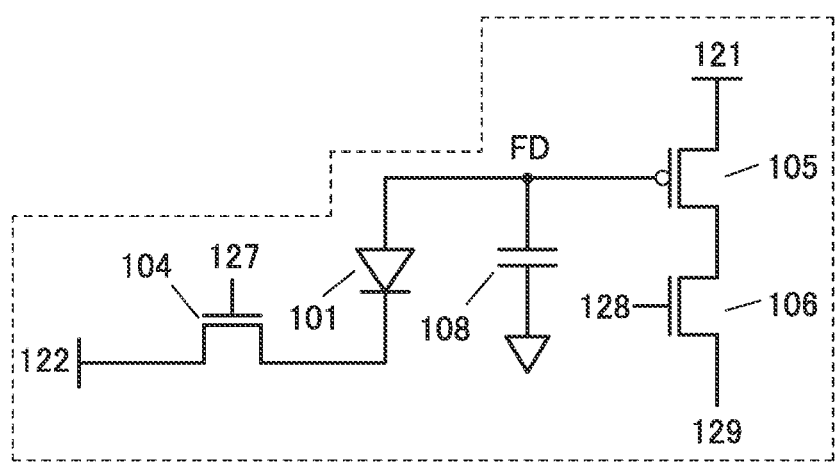

As another structure, a structure may be employed in which the reset potential of the node FD is set to a voltage lower than that of the cathode of the photoelectric conversion device 101 and the photoelectric conversion device 101 is connected in the direction in which a reverse bias is applied, as in modification examples of the circuit 12 illustrated in FIGS. 4(A) and 4(B). The circuit 12 illustrated in FIG. 4(A) can be used as a modification example of the pixels 10a and 10b, and the circuit 12 illustrated in FIG. 4(B) can be used as a modification example of the pixel 10c.

Note that in the structures illustrated in FIGS. 4(A) and 4(B), the operation is preferably performed such that the node FD has a negative potential. Thus, a p-ch transistor is preferably used as at least the transistor 105.

Operation of Circuit 11

The operation for adding voltages in the circuit 11 is described using, as an example, the connection structure of the circuit 11 and the circuit 12 illustrated in FIG. 2. First, the transistor 102 is turned on to write the potential of the wiring 123 "$V_{RS1}$" (reset potential 1) to the node FD. In addition, the transistor 103 is turned on to supply the potential of the wiring 124 "$V_{REF}$" (reference potential) to the other electrode of the capacitor 107. At this time, a potential "$V_{RS1}-V_{REF}$" is retained in the capacitor 107. Next, the node FD is brought into a floating state, and the potential of the wiring 124 "$V_{RS2}$" (reset potential 2) is supplied to the other electrode of the capacitor 107.

At this time, when the capacitance value of the capacitor 107 is represented as $C_{107}$ and the capacitance value of the node FD is represented as $C_{FD}$, the potential of the node FD becomes "$V_{RS1}+(C_{107}/(C_{107}+C_{FD}))\times(V_{RS2}-V_{REF})$". Here, when the value of $C_{107}$ is sufficiently larger than that of $C_{FD}$ and the value of $C_{FD}$ is negligible, the potential of the node FD becomes "$V_{RS1}+V_{RS2}-V_{REF}$".

Therefore, when "$V_{RS1}$"="$V_{RS2}$" and "$V_{REF}$=0 V" are satisfied and $C_{107}$ is sufficiently larger than $C_{FD}$, the potential of the node FD comes close to "$2V_{RS1}$". That is, a voltage approximately twice as high as a voltage that can be supplied to a pixel can be supplied as the reset potential to the node FD.

The high-voltage reset potential supplied to the node FD can be supplied to the photoelectric conversion device 101. Supplying appropriate voltages as "$V_{RS1}$" and "$V_{RS2}$" allows an avalanche photodiode to be operated without the use of a dedicated high voltage power source.

<Operation in Structure Example 1>

Next, an example of the operation of the pixel 10a is described with reference to a timing chart in FIG. 5(A). Note that in the description of a timing chart in this specification, a high potential is represented as "HH" or "H" ("HH">"H"), a low potential is represented as "L", a reset potential is represented as "$V_{RS1}$" or "$V_{RS2}$", and a reference potential is represented as "$V_{REF}$". The wiring 121 is always supplied with "H", and the wiring 122 is always supplied with "L".

Note that in potential distribution, potential coupling, or potential loss, detailed changes due to a circuit structure, operation timing, or the like are not considered. A change in potential due to capacitive coupling using a capacitor depends on the capacitance ratio of the capacitor to a component connected thereto; however, for simplicity of the description, the capacitance value of the component is assumed to be sufficiently small.

In a period T1, the potential of the wiring 123 is set to "$V_{RS1}$", the potential of the wiring 124 is set to "$V_{REF}$", the potential of the wiring 125 is set to "H", the potential of the wiring 126 is set to "H", the potential of the wiring 127 is set to "H", and the potential of the wiring 128 is set to "L", so that the transistors 102 and 104 are turned on and the potential of the wiring 123 "$V_{RS1}$" is supplied to the node FD. In addition, the transistor 103 is turned on; thus, the potential of the wiring 124 "$V_{REF}$" is supplied to the other electrode of the capacitor 107. In the above operation, "$V_{RS1}-V_{REF}$" is retained in the capacitor 107.

In a period T2, the potential of the wiring 123 is set to "$V_{RS1}$", the potential of the wiring 124 is set to "$V_{RS2}$", the potential of the wiring 125 is set to "L", the potential of the wiring 126 is set to "H", the potential of the wiring 127 is set to "H", and the potential of the wiring 128 is set to "L", so that the potential of the wiring 124 "$V_{RS2}$" is supplied to the other electrode of the capacitor 107. At this time, owing to capacitive coupling of the capacitor 107, the potential of the node FD becomes "$V_{RS1}+V_{RS2}$" (reset operation).

As described in the operation of the circuit 11, when the value of $C_{107}$ is sufficiently larger than the value of $C_{FD}$ and the value of $C_{FD}$ is negligible, the potential of the node FD becomes "$V_{RS1}+V_{RS2}-V_{REF}$". Here, when the assumption is made that "$V_{REF}$" is 0 V and $C_{FD}$ actually has a non-negligible value, the potential of the node FD can be represented as "$V_{RS1}+V_{RS2}$".

It is preferable to set "$V_{RS1}$" and "$V_{RS2}$" such that "$V_{RS1}+V_{RS2}$" reaches a voltage at which the photoelectric conversion device 101 exhibits avalanche multiplication characteristics. For example, "$V_{RS1}$" and "$V_{RS2}$" are set to a voltage higher than half of a voltage at which the photoelectric conversion device 101 exhibits avalanche multiplication characteristics.

Furthermore, in the period T2, the potential of the node FD is decreased in accordance with the operation of the photoelectric conversion device 101 (accumulation operation).

In a period T3, the potential of the wiring 123 is set to "$V_{RS1}$", the potential of the wiring 124 is set to "$V_{RS2}$", the potential of the wiring 125 is set to "L", the potential of the wiring 126 is set to "L", the potential of the wiring 127 is set to "L", and the potential of the wiring 128 is set to "L", so that the potential of the node FD is determined and retained (retention operation).

In a period T4, the potential of the wiring 123 is set to "$V_{RS1}$", the potential of the wiring 124 is set to "$V_{RS2}$", the potential of the wiring 125 is set to "L", the potential of the wiring 126 is set to "L", the potential of the wiring 127 is set to "L", and the potential of the wiring 128 is set to "H", so that the transistor 106 is turned on and the potential of the node FD is read out to the wiring 129 by source follower operation of the transistor 105 (reading operation).

The above is an example of the operation of the pixel 10a illustrated in FIG. 1. Note that in the case where the circuit 12 illustrated in FIG. 4(A) is used, negative potentials are used as "$V_{RS1}$" and "$V_{RS2}$".

<Operation in Structure Examples 2 and 3>

Next, an example of the operation of the pixels 10b and 10c is described with reference to a timing chart in FIG. 5(B). Note that the pixels 10b and 10c have different connection modes of circuit components, but can be operated in accordance with the same timing chart.

In the period T1, the potential of the wiring 123 is set to "$V_{RS1}$", the potential of the wiring 124 is set to "$V_{REF}$", the potential of the wiring 125 is set to "H", the potential of the wiring 126 is set to "H", the potential of the wiring 127 is set to "L", and the potential of the wiring 128 is set to "L", so that the transistor 102 is turned on and the potential of the wiring 123 "$V_{RS1}$" is supplied to the node FD. In addition, the transistor 103 is turned on; thus, the potential of the wiring 124 "$V_{REF}$" is supplied to the other electrode of the capacitor 107. In the above operation, "$V_{RS1}-V_{REF}$" is retained in the capacitor 107.

In the period T2, the potential of the wiring 123 is set to "$V_{RS1}$", the potential of the wiring 124 is set to "$V_{RS2}$", the potential of the wiring 125 is set to "L", the potential of the wiring 126 is set to "H", the potential of the wiring 127 is set to "L", and the potential of the wiring 128 is set to "L", so that the potential of the wiring 124 "$V_{RS2}$" is supplied to the other electrode of the capacitor 107. At this time, owing to capacitive coupling of the capacitor 107, the potential of the node FD becomes "$V_{RS1}+V_{RS2}$'" (reset operation).

As described in the operation of the circuit 11, when the value of $C_{107}$ is sufficiently larger than the value of $C_{FD}$ and the value of $C_{FD}$ is negligible, the potential of the node FD becomes "$V_{RS1}+V_{RS2}-V_{REF}$". Here, when the assumption is made that "$V_{REF}$" is 0 V and $C_{FD}$ actually has a non-negligible value, the potential of the node FD can be represented as "$V_{RS1}+V_{RS2}$".

In the period T3, the potential of the wiring 123 is set to "$V_{RS1}$", the potential of the wiring 124 is set to "$V_{RS2}$", the potential of the wiring 125 is set to "L", the potential of the wiring 126 is set to "L", the potential of the wiring 127 is set to "H", and the potential of the wiring 128 is set to "L", so that the potential of the node FD is decreased in response to the operation of the photoelectric conversion device 101 (accumulation operation).

In the period T4, the potential of the wiring 123 is set to "$V_{RS1}$", the potential of the wiring 124 is set to "$V_{RS2}$", the potential of the wiring 125 is set to "L", the potential of the wiring 126 is set to "L", the potential of the wiring 127 is set to "L", and the potential of the wiring 128 is set to "L", so that the potential of the node FD is determined and retained (retention operation).

In a period T5, the potential of the wiring 123 is set to "$V_{RS1}$", the potential of the wiring 124 is set to "$V_{RS2}$", the potential of the wiring 125 is set to "L", the potential of the wiring 126 is set to "L", the potential of the wiring 127 is set to "L", and the potential of the wiring 128 is set to "H", so that the transistor 106 is turned on and the potential of the node FD is read out to the wiring 129 by source follower operation of the transistor 105 (reading operation).

The above is an example of the operation of the pixel 10b illustrated in FIG. 2 and the pixel 10c illustrated in FIG. 3. Note that in the case where the circuit 12 illustrated in FIG. 4(A) is used for the pixel 10b and in the case where the circuit 12 illustrated in FIG. 4(B) is used for the pixel 10c, negative potentials are used as "$V_{RS1}$" and "$V_{RS2}$".

<Modification Examples of Structure Examples 1, 2, and 3>

Figure 6A:
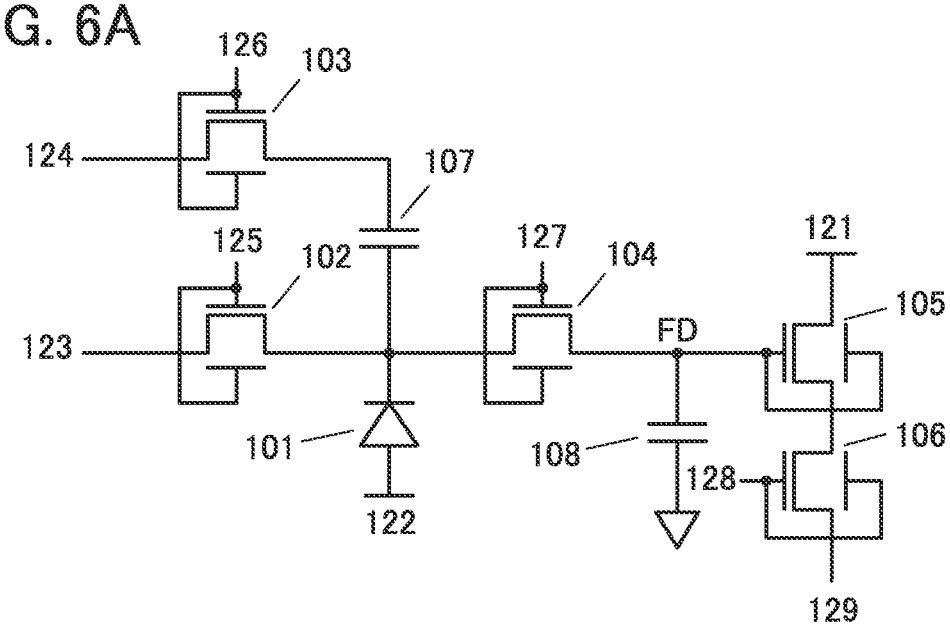
FIGS. 6(A) and 6(B) are diagrams each illustrating a pixel circuit.
Figure 6B:
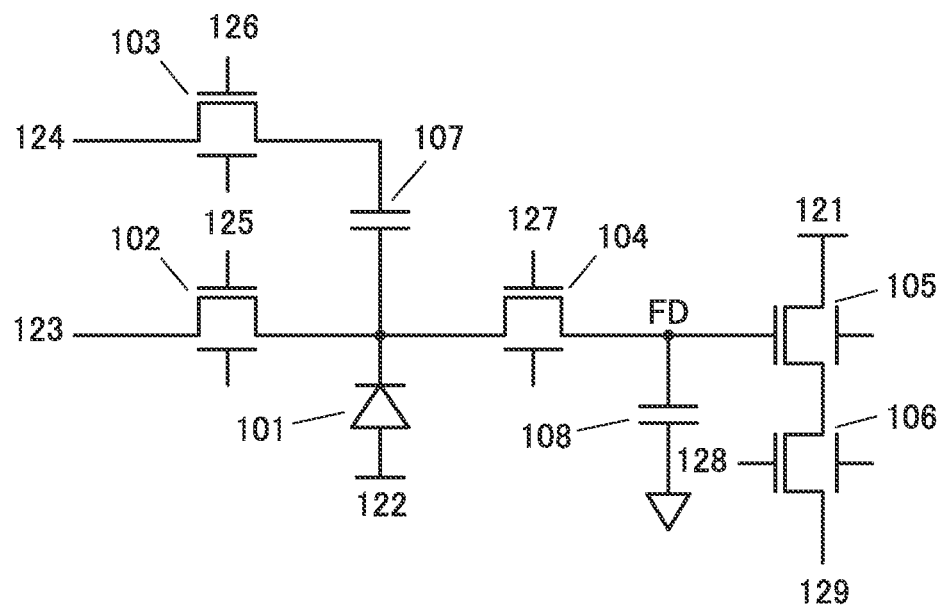

In one embodiment of the present invention, as illustrated in examples of FIGS. 6(A) and 6(B), a structure in which transistors are provided with back gates may be employed. FIG. 6(A) illustrates a structure in which the back gates are electrically connected to front gates, which has an effect of increasing on-state current. FIG. 6(B) illustrates a structure in which the back gates are each electrically connected to a wiring capable of supplying a constant potential, which enables the threshold voltage of the transistors to be controlled.

In addition, a structure which enables each transistor to perform appropriate operation, for example, a structure obtained by combination of FIGS. 6(A) and 6(B), may be employed. The pixel circuit may include a transistor not provided with a back gate. Note that a structure in which a transistor is provided with a back gate can be used for all of the pixels 10a to 10c.

Figure 7A:
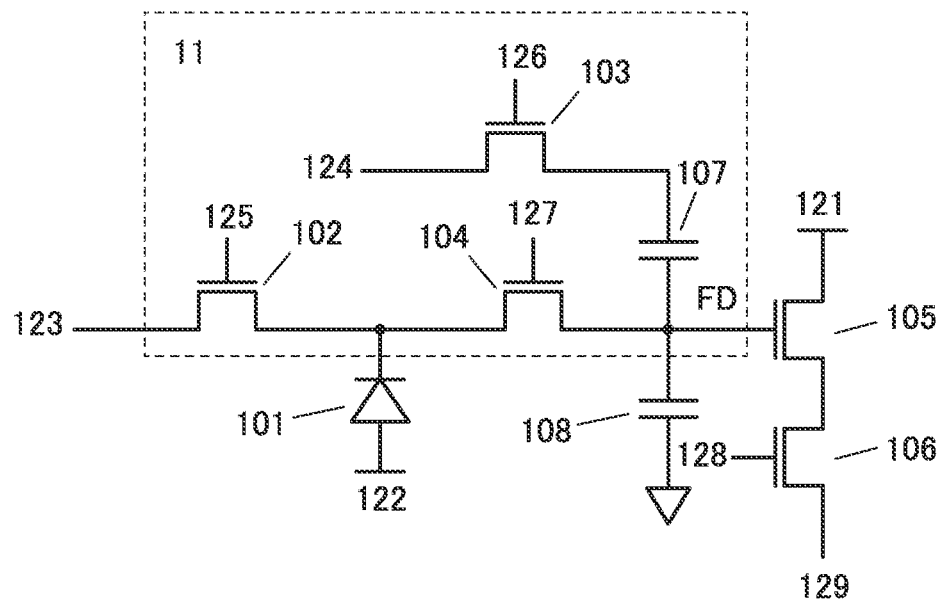
FIGS. 7(A) and 7(B) are diagrams each illustrating a pixel circuit.
Figure 7B:
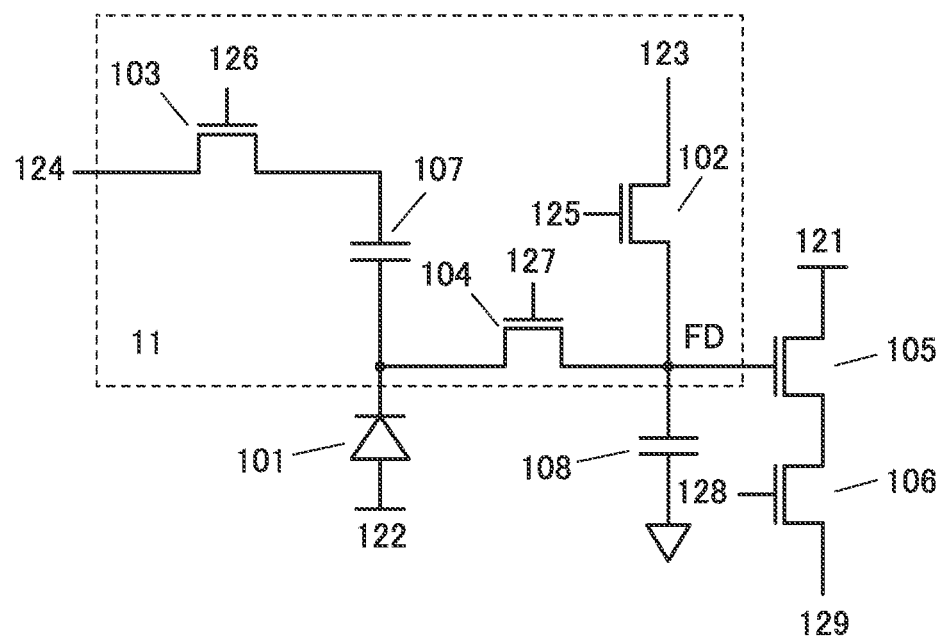

As modification examples of the pixels 10a and 10b, the circuit 11 may have a structure in which one of the source and the drain of the transistor 102 and one electrode of the capacitor 107 are electrically connected to each other through the transistor 104, as illustrated in FIGS. 7(A) and 7(B).

Figure 8:
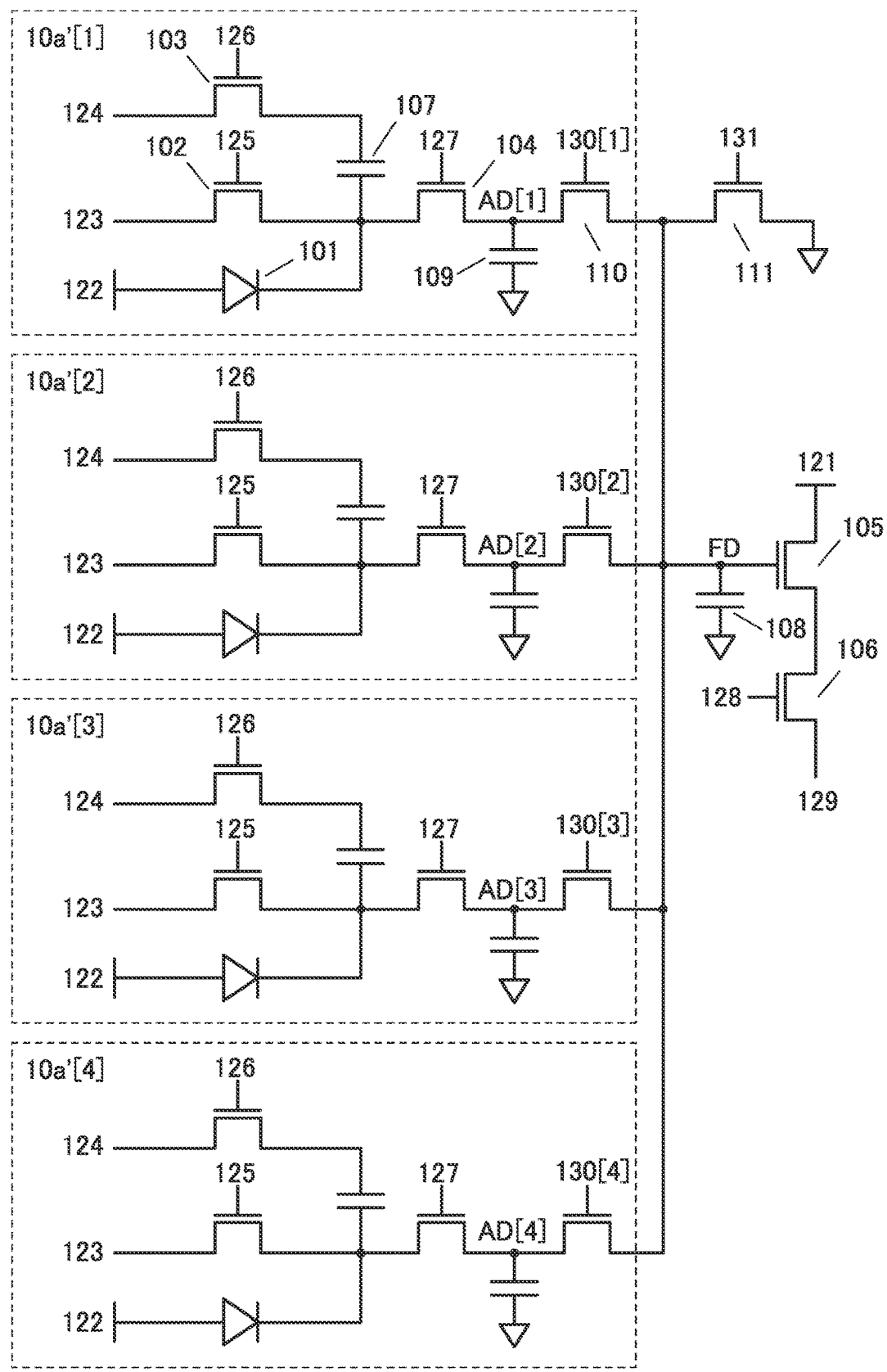
FIG. 8 is a diagram illustrating pixel circuits.

Modification of the pixel 10a, 10b, or 10c enables a structure in which a source follower circuit is shared between the plurality of pixels. For example, a structure illustrated in FIG. 8 is employed. FIG. 8 is a structure based on the structure of the pixel 10a, to which appropriate components are added, and that can be used for a global shutter system. When the plurality of pixels share the source follower circuit, the number of transistors in each pixel can be reduced.

FIG. 8 illustrates a structure of a sharing-type pixel circuit in which four pixels arranged in the vertical direction share a reset circuit (transistor 111) and the source follower circuit (transistor 105). A pixel 10a' (pixels 10a'[1] to [4]) includes a capacitor 109 and a transistor 110 in addition to the components of the pixel 10a.

One electrode of the capacitor 109 is electrically connected to the other of the source and the drain of the transistor 104. The other of the source and the drain of the transistor 104 is electrically connected to one of a source and a drain of the transistor 110. The other of the source and the drain of the transistor 110 is electrically connected to one of a source and a drain of the transistor 111. The one of the source and the drain of the transistor 111 is electrically connected to the gate of the transistor 105.

The other electrode of the capacitor 109 and the other of the source and the drain of the transistor 111 are electrically connected to a reference potential line such as a GND wiring, for example. A gate of the transistor 110 is electrically connected to a wiring 130. A gate of the transistor 111 is electrically connected to a wiring 131. The wiring 130 (wirings 130[1] to [4]) and the wiring 131 can function as signal lines for controlling the conduction of the respective transistors.

In each of the pixels 10a'[1] to [4], a wiring to which the other of the source and the drain of the transistor 110, the one of the source and the drain of the transistor 111, and the gate of the transistor 105 are connected is the node FD. A wiring that connects the other of the source and the drain of the transistor 104, the one electrode of the capacitor 109, and the one of the source and the drain of the transistor 110 is a node AD. The node AD has a function of retaining data captured in each pixel.

Figure 9:
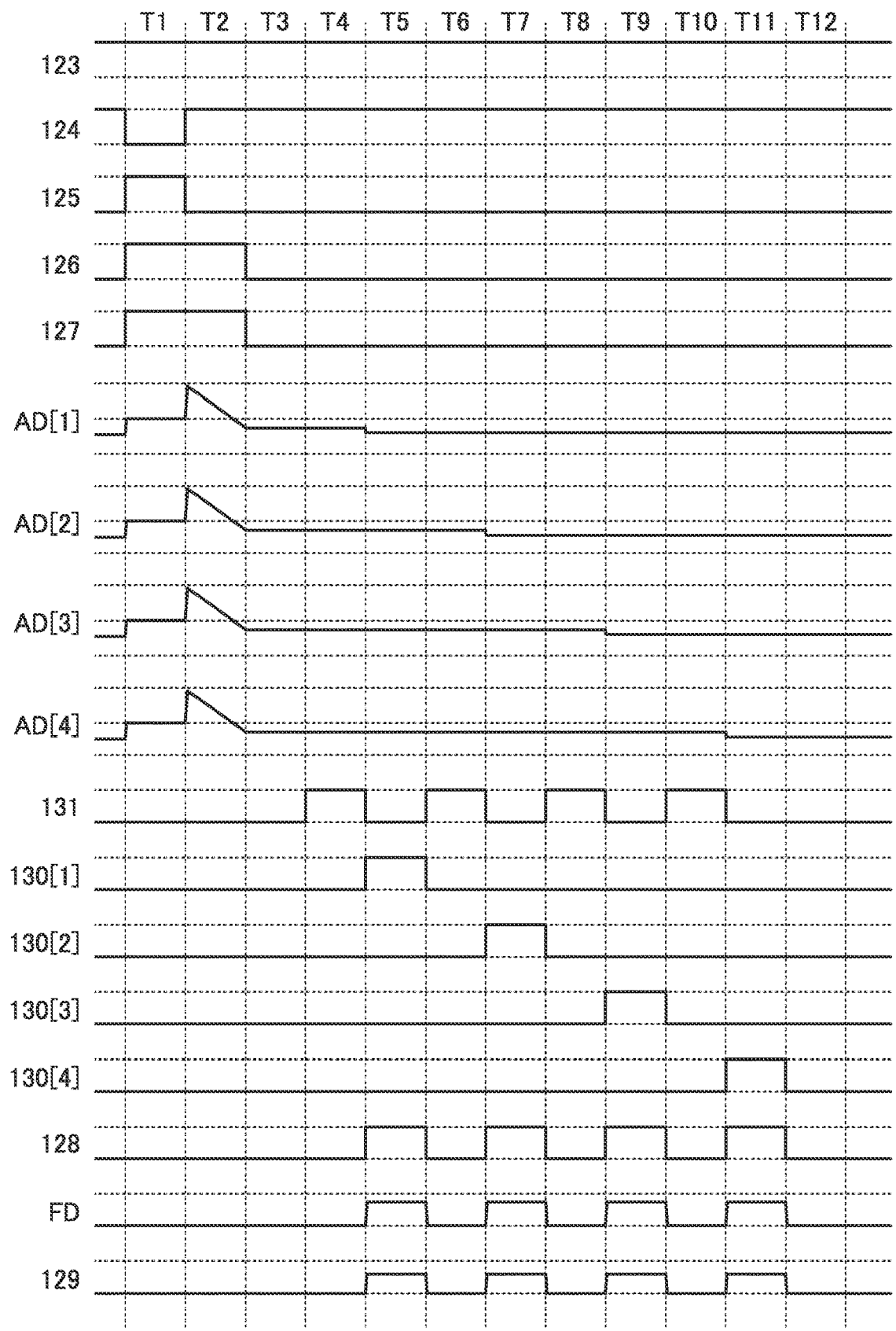
FIG. 9 is a timing chart showing the operation of a pixel circuit.

The operation of the sharing-type pixel circuit illustrated in FIG. 8 is described with reference to a timing chart in FIG. 9. Note that the operation is a global shutter system in which accumulation operation is performed in all the pixels at the same time.

For the operation in the period T1 to the period T3, refer to the description of the operation of the pixel 10a. Note that data obtained in the accumulation operation is retained in nodes AD[1] to [4].

In the period T4, the potential of the wiring 131 is set to "H", so that the transistor 111 is turned on and the potential of the node FD is reset. The reset potential can be GND or 0 V, for example.

In the period T5, the potential of the wiring 131 is set to "L", the potential of the wiring 130[1] is set to "H", and the potential of the wiring 128 is set to "H", so that the transistor 110 is turned on and the potential of the node AD[1] is distributed to the node FD. In addition, owing to the source follower operation of the transistor 105 and the conduction of the transistor 106, a potential based on the potential of the node FD is read out to the wiring 129.

Since data is retained in the nodes AD[2] to [4], repeating the above operation from the period T6 to the period T12 enables data to be read out from the pixels 10a'[1] to [4].

Figure 10:
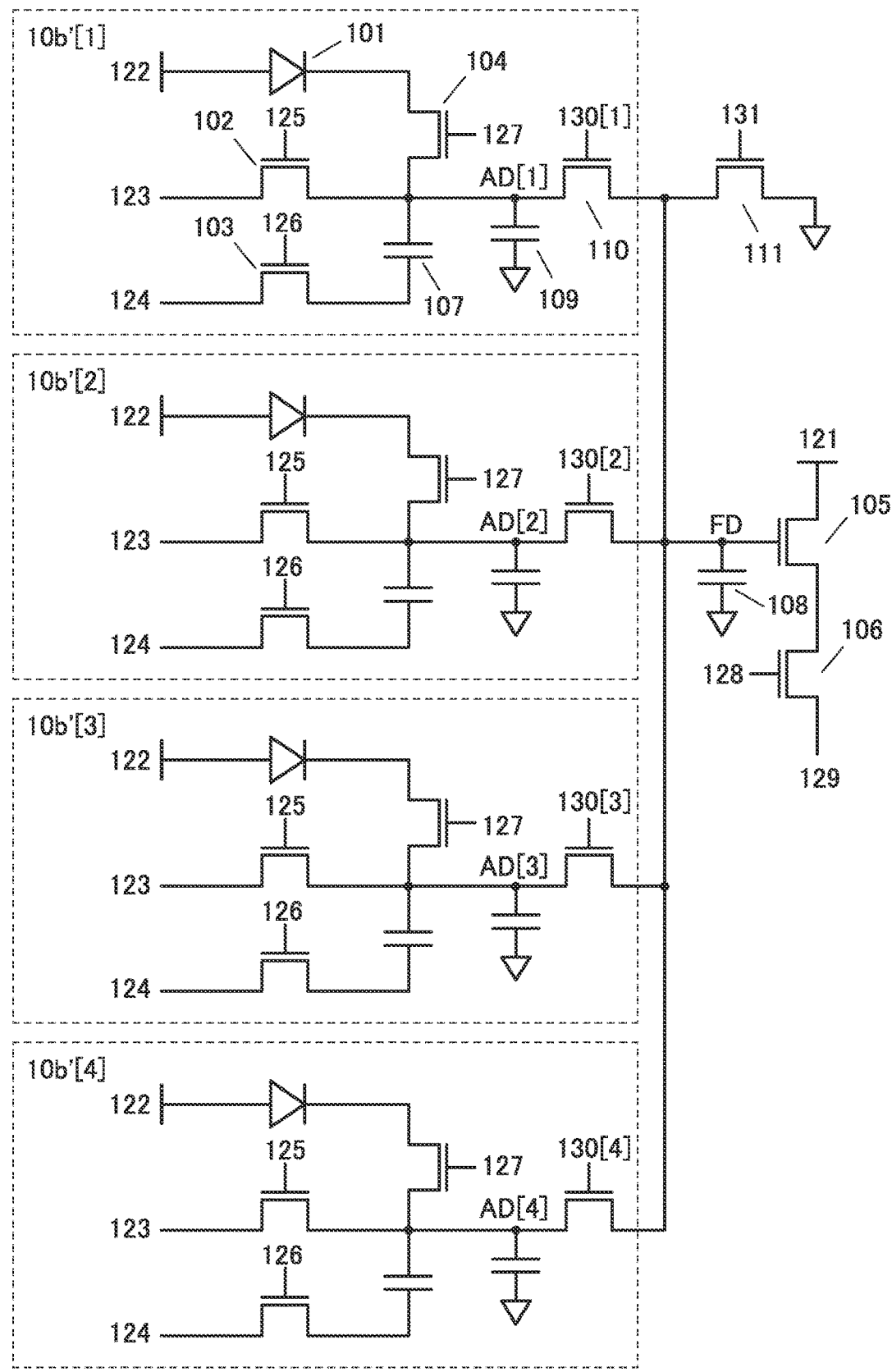
FIG. 10 is a diagram illustrating pixel circuits.
Figure 11:
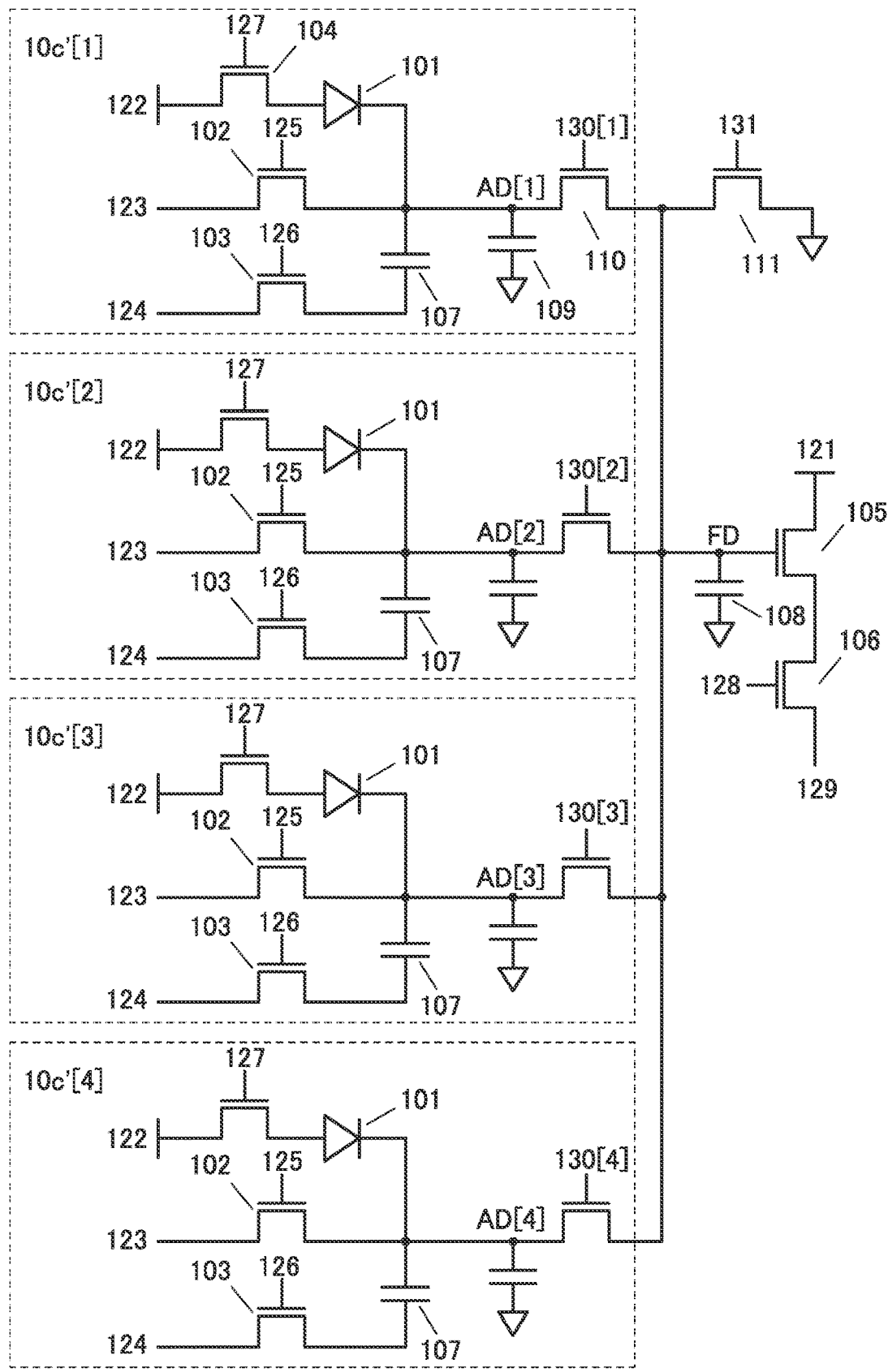
FIG. 11 is a diagram illustrating pixel circuits.
Figure 12:
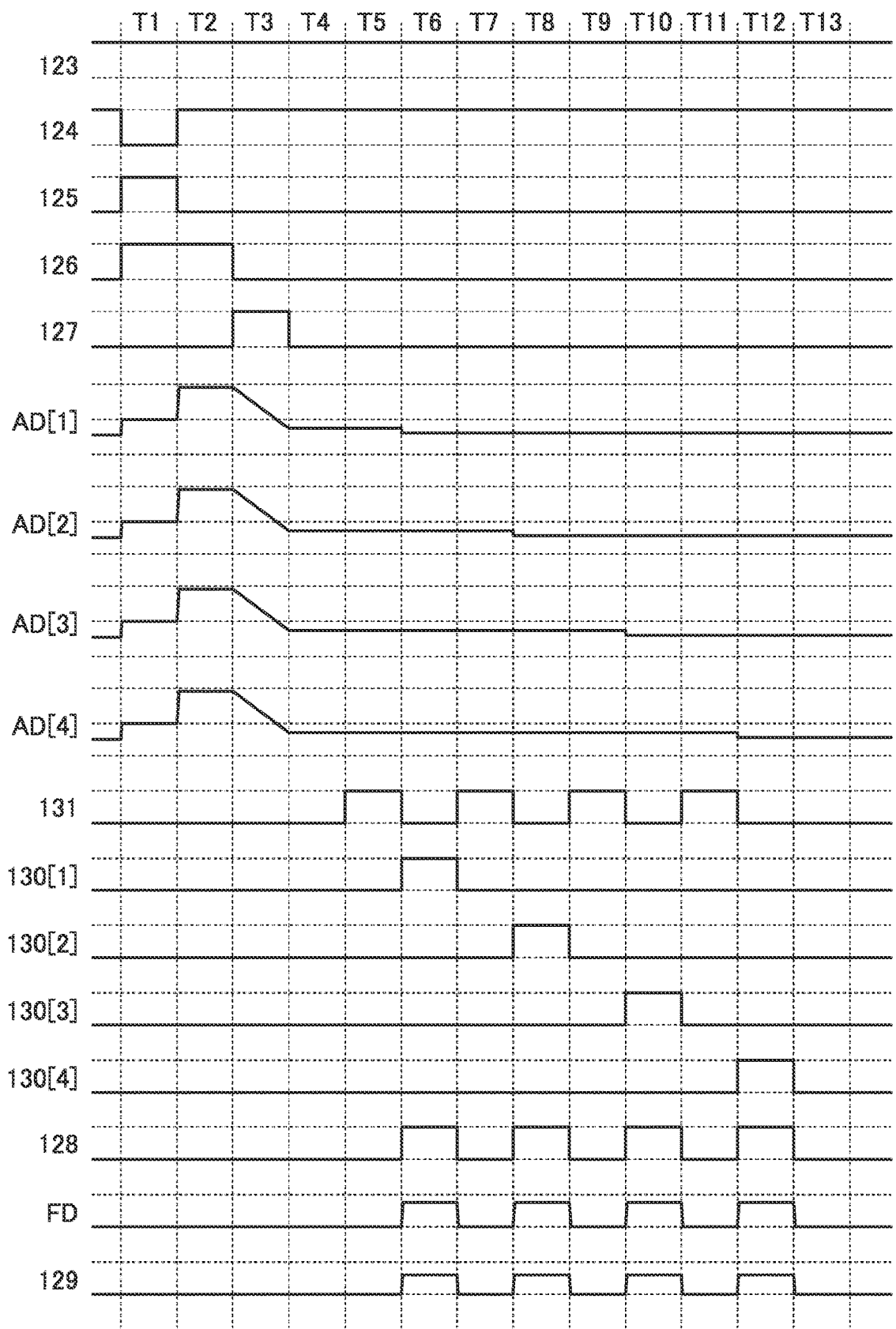
FIG. 12 is a timing chart showing the operation of a pixel circuit.

As in the above description, the pixel 10b and the pixel 10c can also have a structure of a sharing-type pixel circuit. FIG. 10 illustrates a structure in which the pixel 10b employs a sharing-type pixel circuit including four pixels arranged in the vertical direction (pixels 10b'[1] to [4]). FIG. 11 illustrates a structure in which the pixel 10c employs a sharing-type pixel circuit including four pixels arranged in the vertical direction (pixels 10c'[1] to [4]). Both of the sharing-type pixel circuits can be operated in accordance with a timing chart in FIG. 12.

Figure 13:
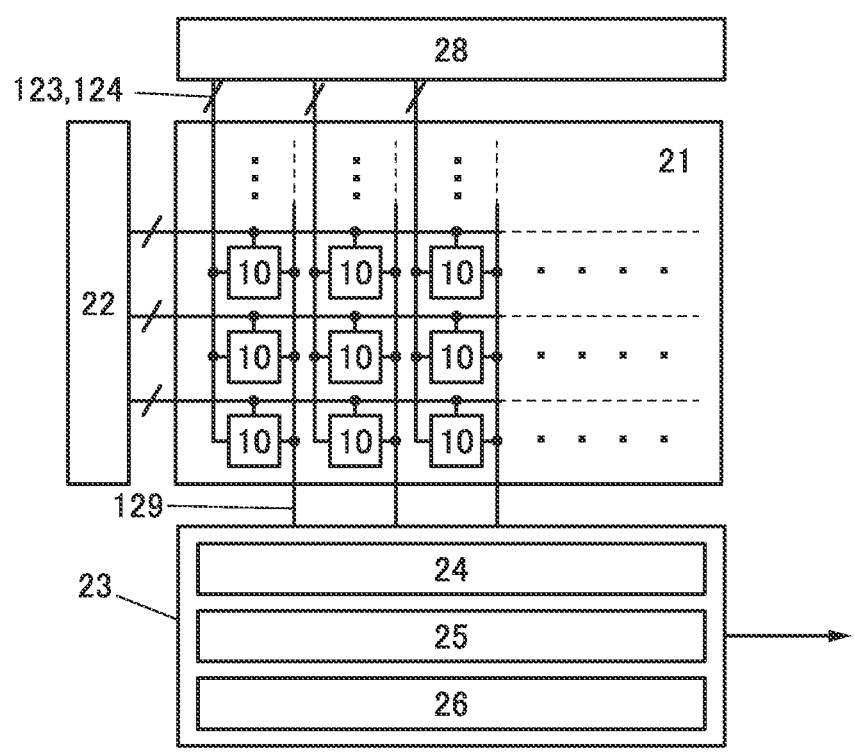
FIG. 13 is a block diagram illustrating an imaging device.

FIG. 13 is an example of a block diagram illustrating a circuit structure of the imaging device of one embodiment of the present invention. The imaging device includes a pixel array 21 including pixels 10 arranged in a matrix, a circuit 22 having a function of selecting a row of the pixel array 21 (row driver), a circuit 23 having a function of reading out data from the pixels 10, and a circuit 28 for supplying a power supply potential. Any of the pixels 10a, 10b, and 10c and the modification examples thereof can be used as the pixels 10.

The circuit 23 includes a circuit 24 having a function of selecting a column of the pixel array 21 (column driver), a circuit 25 for performing correlated double sampling treatment on output data from the pixels 10 (CDS circuit), and a circuit 26 having a function of converting analog data output from the circuit 25 into digital data (A/D converter circuit or the like).

The circuit 23 is electrically connected to the wiring 129, and converts the data output from the pixels 10 into digital data and then can output the data to the outside. For example, the output destination can be a neural network, a memory device, a display device, a communication device, or the like.

Next, simulation results of the operation of the pixel circuit are described. The simulation is performed on the assumption of the pixel 10a illustrated in FIG. 1 and the pixel 10b illustrated in FIG. 2 to calculate the potential of the node FD.

Parameters used in the simulation are as follows: the transistor sizes are L/W=3 μm/10 μm (the transistors 102, 103, and 104) and L/W=3 μm/50 μm (the transistors 105 and 106), the capacitance value of the capacitor 107 is 200 fF, the capacitance value of the capacitor 108 is 100 fF (which is not set in the pixel 10a), the capacitance value of the photoelectric conversion device 101 is 20 fF, the reset potential 1 ($V_{RS1}$) is 20 V, and the reset potential 2 ($V_{RS2}$) is 26 V. In addition, a voltage applied to a gate of a transistor is set to +26 V or +46 V as "H" and 0 V as "L". Note that SPICE is used as circuit simulation software.

Figure 5A:
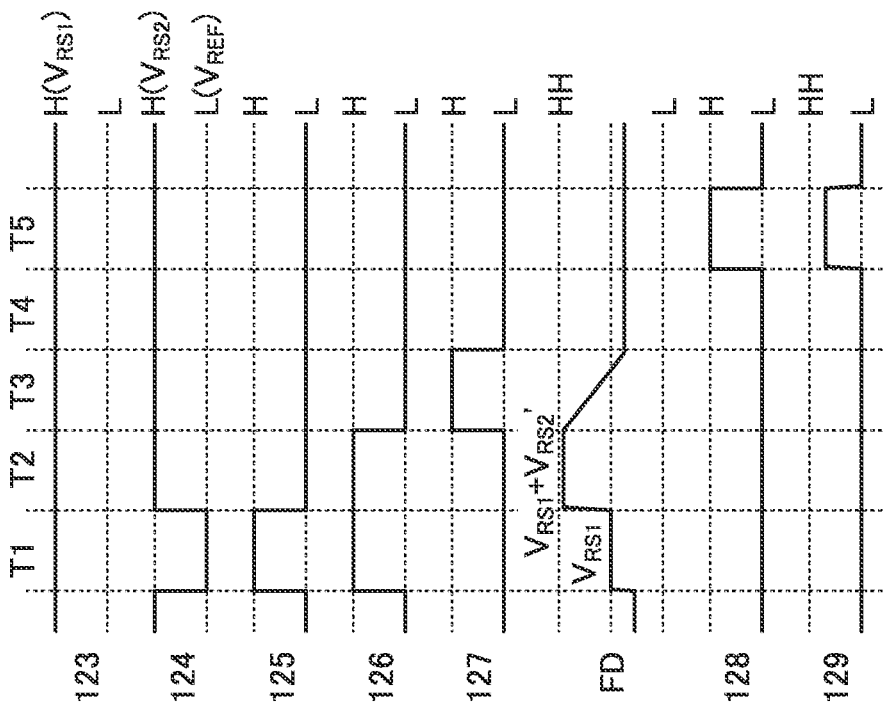
FIGS. 5(A) and 5(B) are timing charts showing the operation of a pixel circuit.
Figure 14A:
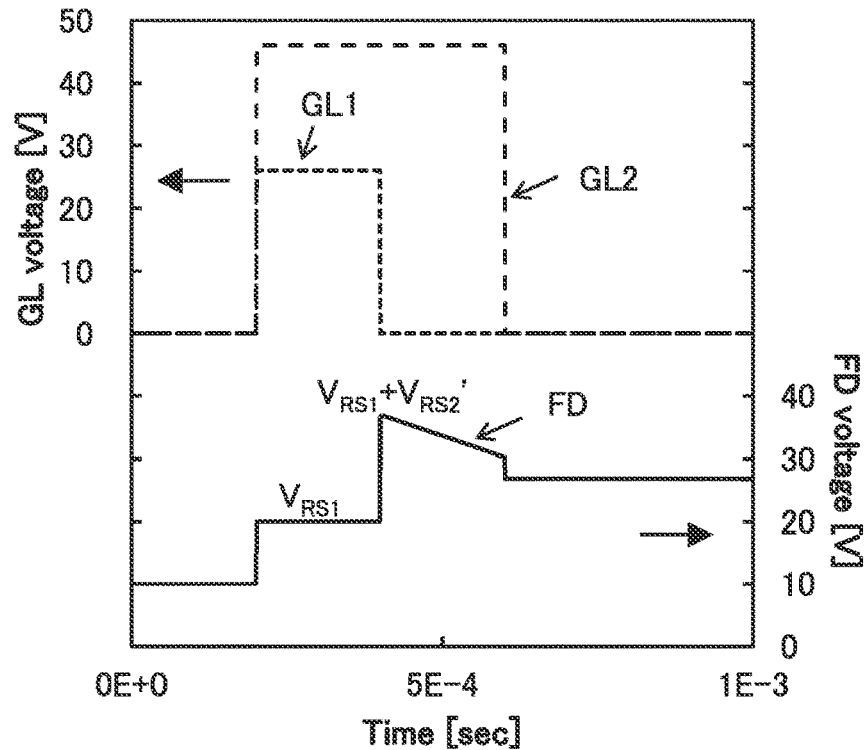
FIGS. 14(A) and 14(B) are diagrams showing simulation results.

FIG. 14(A) shows simulation results at the time when the pixel 10a is operated in accordance with the timing chart in FIG. 5(A). The horizontal axis represents time, the vertical axis (left) represents voltage supplied to gate wirings (GL1 and GL2), and the vertical axis (right) represents voltage of the node FD. Note that GL1 corresponds to the wiring 125, and GL2 corresponds to the wiring 126.

It is found that $V_{RS1}$ is written to the node FD and then $V_{RS2}$ is added in accordance with the capacitance ratio, whereby a high voltage ($V_{RS1}+V_{RS2}'$) can be generated.

Figure 5B:
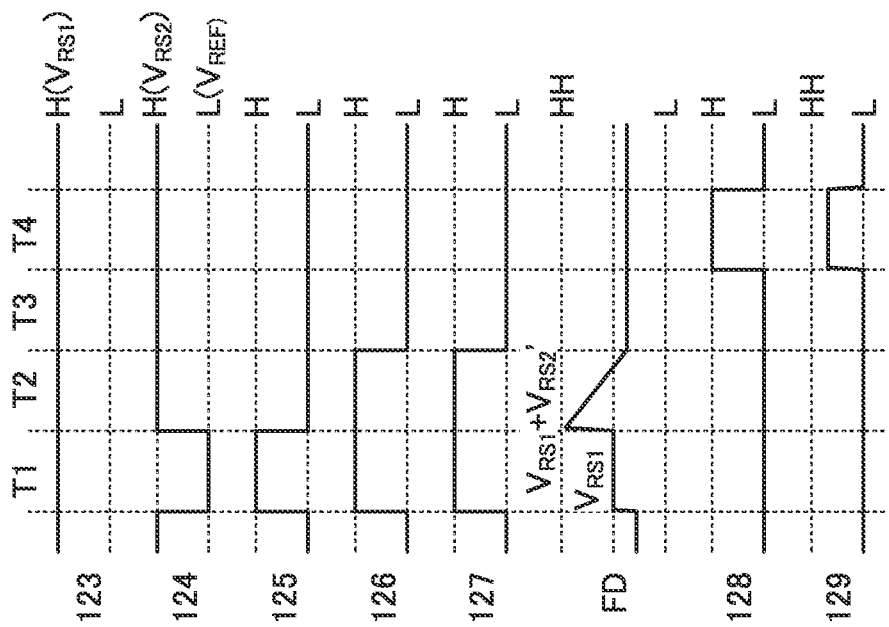
Figure 14B:
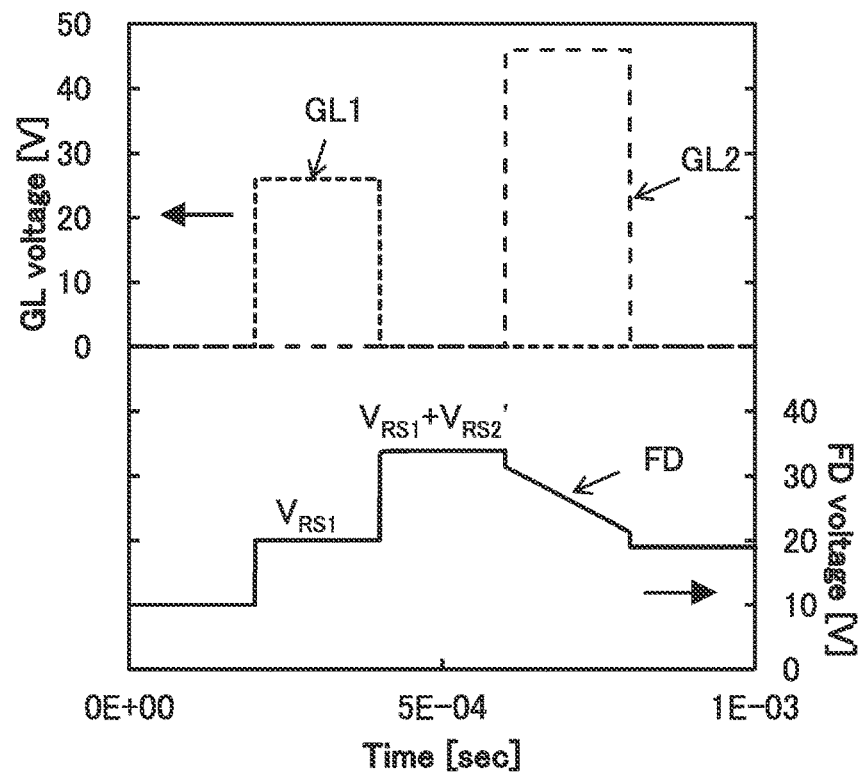

FIG. 14(B) shows simulation results at the time when the pixel 10b is operated in accordance with the timing chart in FIG. 5(B). It is found that, as in the pixel 10a, $V_{RS1}$ is written to the node FD and then $V_{RS2}$ is added in accordance with the capacitance ratio, whereby a high voltage ($V_{RS1}+V_{RS2}'$) can be generated.

The above simulation results demonstrate that using one embodiment of the present invention enables a high voltage to be generated in a pixel without the use of a high voltage power supply circuit, and allows an avalanche photodiode to be operated.

This embodiment can be combined with the description of other embodiments as appropriate.

Embodiment 2

In this embodiment, structure examples and the like of the imaging device of one embodiment of the present invention are described.

Figure 15A:
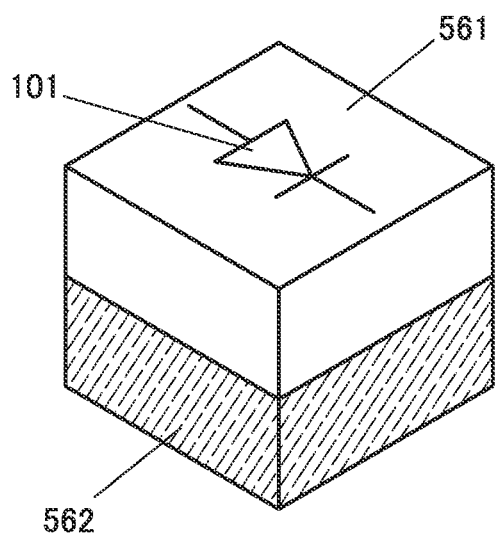
FIGS. 15(A) to 15(E) are diagrams illustrating structures of a pixel in an imaging device.
Figure 15B:
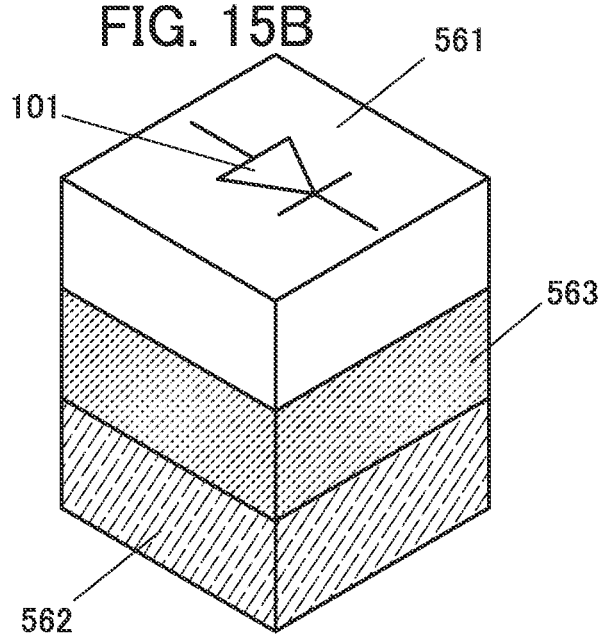

FIGS. 15(A) and 15(B) illustrate examples of a structure of a pixel included in the imaging device. The pixel illustrated in FIG. 15(A) has a stacked-layer structure of a layer 561 and a layer 562, for example.

The layer 561 includes the photoelectric conversion device 101. The photoelectric conversion device 101 can be a stacked layer of a layer 565a, a layer 565b, and a layer 565c as illustrated in FIG. 15(C).

Figure 15C:
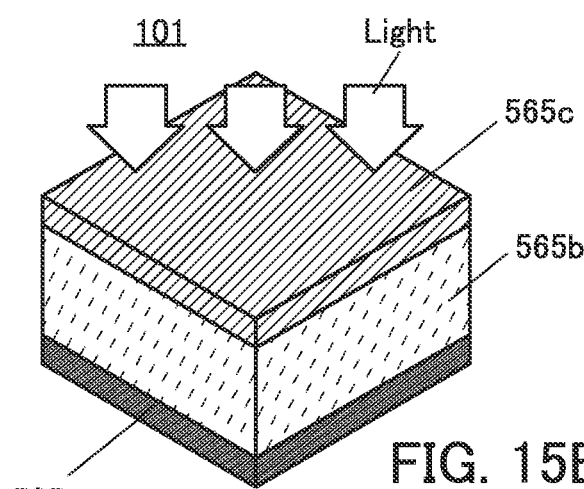

The photoelectric conversion device 101 illustrated in FIG. 15(C) is a pn-junction photodiode; for example, a $p^+$-type semiconductor can be used for the layer 565a, an n-type semiconductor can be used for the layer 565b, and an $n^+$-type semiconductor can be used for the layer 565c.

Alternatively, an n+-type semiconductor may be used for the layer 565a, a p-type semiconductor may be used for the layer 565b, and a p+-type semiconductor may be used for the layer 565c. Alternatively, a pin-junction photodiode in which the layer 565b is an i-type semiconductor may be used.

The pn-junction photodiode or the pin-junction photodiode can be formed using single crystal silicon. The pin-junction photodiode can also be formed using a thin film of amorphous silicon, microcrystalline silicon, polycrystalline silicon, or the like.

Figure 15D:
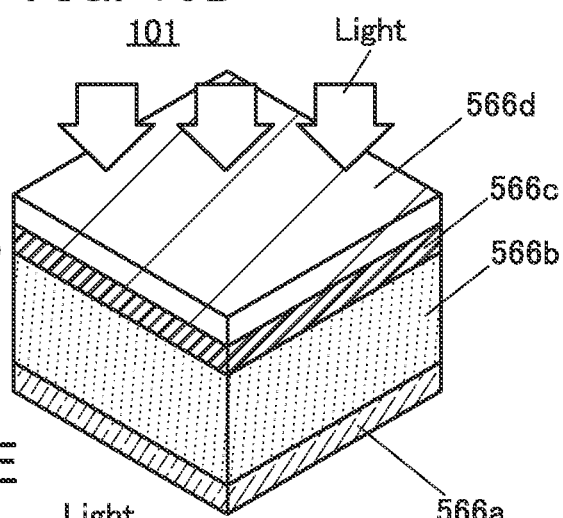

The photoelectric conversion device 101 included in the layer 561 may be a stacked layer of a layer 566a, a layer 566b, a layer 566c, and a layer 566d, as illustrated in FIG. 15(D). The photoelectric conversion device 101 illustrated in FIG. 15(D) is an example of an avalanche photodiode, and the layer 566a and the layer 566d correspond to electrodes and the layers 566b and 566c correspond to a photoelectric conversion portion.

A low-resistance metal layer or the like is preferably used as the layer 566a. For example, aluminum, titanium, tungsten, tantalum, silver, or a stacked layer thereof can be used.

A conductive layer having a high light-transmitting property with respect to visible light is preferably used as the layer 566d. For example, indium oxide, tin oxide, zinc oxide, indium tin oxide, gallium zinc oxide, indium gallium zinc oxide, graphene, or the like can be used. Note that a structure in which the layer 566d is omitted can also be employed.

A structure of a pn-junction photodiode containing a selenium-based material in a photoelectric conversion layer can be used for the layers 566b and 566c of the photoelectric conversion portion, for example. A selenium-based material, which is a p-type semiconductor, is preferably used for the layer 566b, and gallium oxide or the like, which is an n-type semiconductor, is preferably used for the layer 566c.

A photoelectric conversion device containing a selenium-based material has characteristics of high external quantum efficiency with respect to visible light. In the photoelectric conversion device, electrons are greatly amplified with respect to the amount of incident light (Light) by utilizing the avalanche multiplication. A selenium-based material has a high light-absorption coefficient and thus has advantages in production; for example, a photoelectric conversion layer can be formed using a thin film. A thin film of a selenium-based material can be formed by a vacuum evaporation method, a sputtering method, or the like.

As a selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed using a material with a wide band gap and a light-transmitting property with respect to visible light. For example, zinc oxide, gallium oxide, indium oxide, tin oxide, or mixed oxide thereof can be used. In addition, these materials have a function of a hole-injection blocking layer, so that a dark current can be decreased.

Figure 15E:
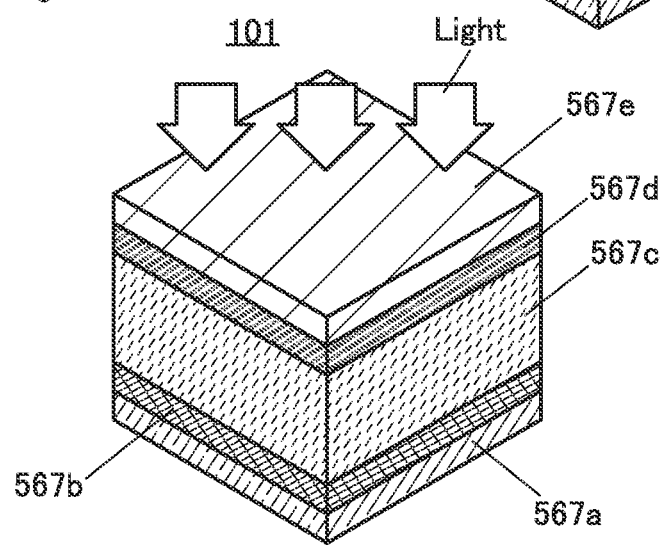

The photoelectric conversion device 101 included in the layer 561 may be a stacked layer of a layer 567a, a layer 567b, a layer 567c, a layer 567d, and a layer 567e as illustrated in FIG. 15(E). The photoelectric conversion device 101 illustrated in FIG. 15(E) is an example of an organic optical conductive film, and the layer 567a and the layer 567e correspond to electrodes and the layers 567b, 567c, and 567d correspond to a photoelectric conversion portion.

One of the layers 567b and 567d in the photoelectric conversion portion can be a hole-transport layer and the other can be an electron-transport layer. The layer 567c can be a photoelectric conversion layer.

For the hole-transport layer, molybdenum oxide can be used, for example. For the electron-transport layer, fullerene such as C60 or C70, or a derivative thereof can be used, for example.

As the photoelectric conversion layer, a mixed layer of an n-type organic semiconductor and a p-type organic semiconductor (bulk heterojunction structure) can be used.

For the layer 562 illustrated in FIG. 15(A), a silicon substrate can be used, for example. The silicon substrate includes a Si transistor or the like. With the use of the Si transistor, as well as a pixel circuit, a circuit for driving the pixel circuit, a circuit for reading out an image signal, an image processing circuit, or the like can be provided. Specifically, some or all of the transistors included in the pixel circuits and the peripheral circuits (the pixels 10, the circuits 22, 23, and 28, and the like) described in Embodiment 1 can be provided in the layer 562.

Furthermore, the pixel may have a stacked-layer structure of the layer 561, a layer 563, and the layer 562 as illustrated in FIG. 15(B).

The layer 563 can include OS transistors (for example, the transistors 102, 103, and 104 of the pixel 10a). In that case, the layer 562 may include Si transistors (for example, the transistors 105 and 106 of the pixel 10a). Furthermore, some of the transistors included in the peripheral circuits described in Embodiment 1 may be provided in the layer 563.

With such a structure, components of the pixel circuit and the peripheral circuits can be dispersed in a plurality of layers and the components can be provided to overlap with each other or any of the components and any of the peripheral circuits can be provided to overlap with each other, whereby the area of the imaging device can be reduced. Note that in the structure of FIG. 15(B), the layer 562 may be a support substrate, and the pixels 10 and the peripheral circuits may be provided in the layer 561 and the layer 563.

As a semiconductor material used for an OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium, and a CAAC-OS (C-Axis Aligned Crystalline Oxide Semiconductor), a CAC (Cloud-Aligned Composite)-OS, each of which will be described later, or the like can be used, for example. A CAAC-OS has a crystal structure including stable atoms and is suitable for a transistor that is required to have high reliability, and the like. A CAC-OS has high mobility and is suitable for a transistor that operates at high speed, and the like.

In the OS transistor, a semiconductor layer has a large energy gap, and thus the OS transistor has an extremely low off-state current of several yoctoamperes per micrometer (current per micrometer of a channel width). The OS transistor has the following feature different from that of a Si transistor: impact ionization, an avalanche breakdown, a short-channel effect, or the like does not occur, and thus can configure a circuit having a high withstand voltage and high reliability. Moreover, variations in electrical characteristics due to crystallinity unevenness, which are caused in the Si transistor, are less likely to occur in the OS transistor.

The semiconductor layer included in the OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the oxide semiconductor contained in the semiconductor layer is an In-M-Zn-based oxide, it is preferable that the atomic ratio of metal elements of a sputtering target used for forming a film of the In-M-Zn oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, InM:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratios of metal elements of the sputtering target in a range of ±40%.

An oxide semiconductor with low carrier density is used for the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

Note that the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (the concentration obtained by secondary ion mass spectrometry) in the semiconductor layer is set to lower than or equal to $2\times10^{18}$ atoms/$cm^3$, preferably lower than or equal to $2\times10^{17}$ atoms/$cm^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by secondary ion mass spectrometry) is set to lower than or equal to $1\times10^{18}$ atoms/$cm^3$, preferably lower than or equal to $2\times10^{16}$ atoms/$cm^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the nitrogen concentration (the concentration obtained by secondary ion mass spectrometry) in the semiconductor layer is preferably set to lower than or equal to $5\times10^{18}$ atoms/$cm^3$.

When hydrogen is contained in the oxide semiconductor contained in the semiconductor layer, hydrogen reacts with oxygen bonded to a metal atom to be water, and thus sometimes forms oxygen vacancies in the oxide semiconductor. When the channel formation region in the oxide semiconductor includes oxygen vacancies, the transistor sometimes has normally-on characteristics. In some cases, a defect in which hydrogen enters oxygen vacancies functions as a donor and generates electrons serving as carriers. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen enters oxygen vacancies can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is obtained by secondary ion mass spectrometry (SIMS), is lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$. When an oxide semiconductor with sufficiently reduced impurities such as hydrogen is used for a channel formation region of a transistor, stable electrical characteristics can be given.

The semiconductor layer may have a non-single-crystal structure, for example. Examples of the non-single-crystal structure include CAAC-OS (C-Axis Aligned Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide semiconductor film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. It is particularly preferable that indium and zinc be contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)) and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite oxide semiconductor having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ (−1≤x0≤1; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

On the other hand, the CAC-OS relates to the material composition of an oxide semiconductor. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ or the like as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions including $GaO_{X3}$ or the like as a main component and regions including $In_{X2}Zn_{Y2}O_{Z2}$ or $InO_{X1}$ as a main component are phase-separated from each other and form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

By contrast, a region including $GaO_{X3}$ or the like as a main component is a region whose insulating property is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current (Ion) and high field-effect mobility (μ) can be achieved.

A semiconductor element using the CAC-OS has high reliability. Thus, the CAC-OS is suitably used as a constituent material of a variety of semiconductor devices.

Figure 16A:
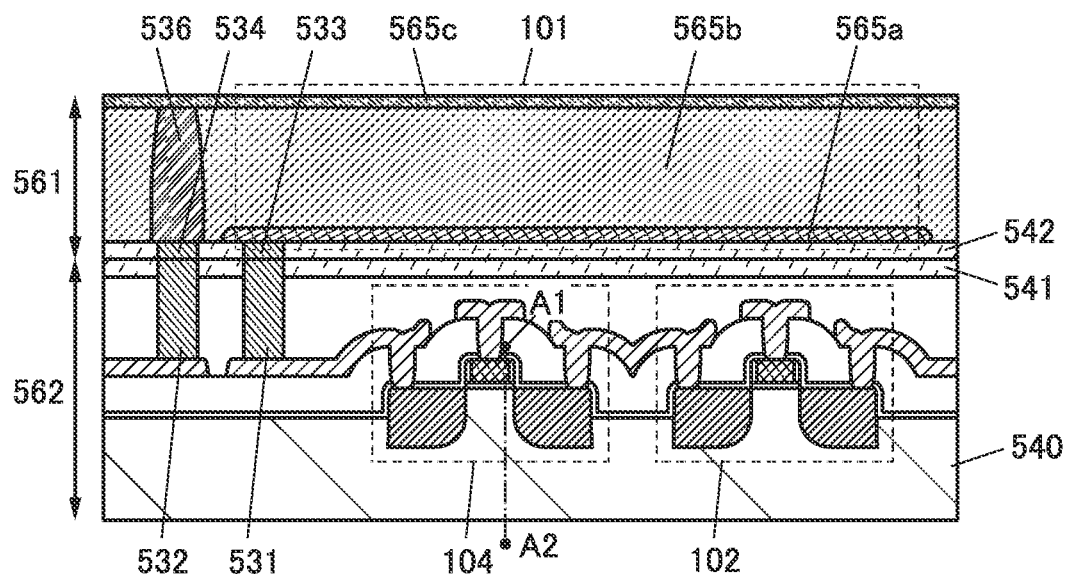
FIGS. 16(A) and 16(B) are diagrams illustrating structures of a pixel in an imaging device.

FIG. 16(A) is a diagram illustrating an example of a cross section of the pixel illustrated in FIG. 15(A). The layer 561 includes a pn-junction photodiode with silicon for a photoelectric conversion layer, as the photoelectric conversion device 101. The layer 562 includes a Si transistor, and FIG. 16(A) illustrates the transistors 102 and 104 included in the pixel circuit, with the use of the pixel 10b as an example.

In the photoelectric conversion device 101, the layer 565a can be a $p^+$-type region, the layer 565b can be an n-type region, and the layer 565c can be an $n^+$-type region. The layer 565b is provided with a region 536 for connecting a power supply line to the layer 565c. For example, the region 536 can be a $p^+$-type region.

Figure 17A:
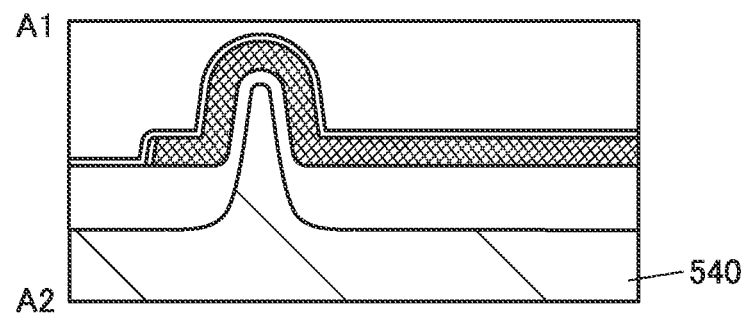
FIGS. 17(A) to 17(C) are diagrams illustrating transistors.
Figure 17B:
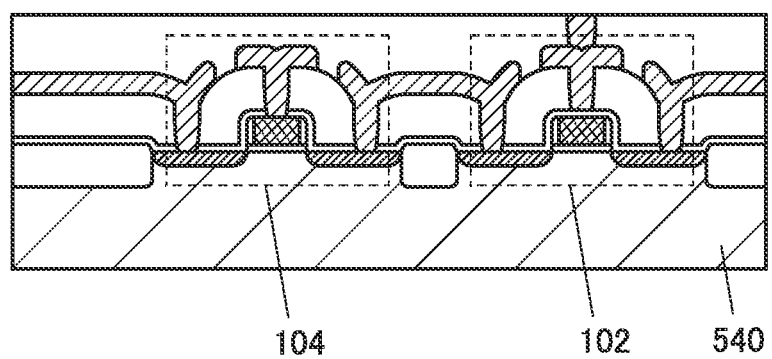

The Si transistor illustrated in FIG. 16(A) has a fin-type structure including a channel formation region in a silicon substrate 540, and FIG. 17(A) shows a cross section in the channel width direction. The Si transistor may have a planar-type structure as illustrated in FIG. 17(B).

Figure 17C:
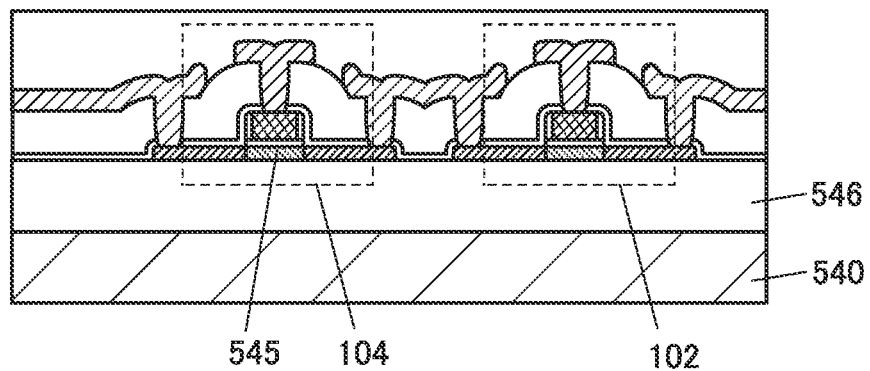

Alternatively, as illustrated in FIG. 17(C), a transistor including a semiconductor layer 545 of a silicon thin film may be used. The semiconductor layer 545 can be single crystal silicon (SOI (Silicon on Insulator)) formed on an insulating layer 546 on the silicon substrate 540, for example.

FIG. 16(A) illustrates an example of a structure in which electrical connection between components included in the layer 561 and components included in the layer 562 is obtained by a bonding technique.

An insulating layer 542, a conductive layer 533, and a conductive layer 534 are provided in the layer 561. The conductive layer 533 and the conductive layer 534 each include a region embedded in the insulating layer 542. The conductive layer 533 is electrically connected to the layer 565a. The conductive layer 534 is electrically connected to the region 536. Furthermore, the surfaces of the insulating layer 542, the conductive layer 533, and the conductive layer 534 are planarized to have the same level.

An insulating layer 541, a conductive layer 531, and a conductive layer 532 are provided in the layer 562. The conductive layer 531 and the conductive layer 532 each include a region embedded in the insulating layer 541. The conductive layer 532 is electrically connected to a power supply line. The conductive layer 531 is electrically connected to the source or the drain of the transistor 104. Furthermore, the surfaces of the insulating layer 541, the conductive layer 531, and the conductive layer 532 are planarized to have the same level.

Here, main components of the conductive layer 531 and the conductive layer 533 are preferably the same metal element. Main components of the conductive layer 532 and the conductive layer 534 are preferably the same metal element. Furthermore, it is preferable that the insulating layer 541 and the insulating layer 542 be formed of the same component.

For example, for the conductive layers 531, 532, 533, and 534, Cu, Al, Sn, Zn, W, Ag, Pt, Au, or the like can be used. Preferably, Cu, Al, W, or Au is used for easy bonding. In addition, for the insulating layers 541 and 542, silicon oxide, silicon oxynitride, silicon nitride oxide, silicon nitride, titanium nitride, or the like can be used.

That is, the same metal material selected from the above is preferably used for the combination of the conductive layer 531 and the conductive layer 533, and the same metal material selected from the above is preferably used for the combination of the conductive layer 532 and the conductive layer 534. Furthermore, the same insulating material selected from the above is preferably used for the insulating layer 541 and the insulating layer 542. With this structure, bonding where a boundary between the layer 561 and the layer 562 is a bonding position can be performed.

This bonding enables electrical connection between the combination of the conductive layer 531 and the conductive layer 533 and between the combination of the conductive layer 532 and the conductive layer 534. In addition, connection between the insulating layer 541 and the insulating layer 542 with mechanical strength can be obtained.

For bonding the metal layers to each other, a surface activated bonding method in which an oxide film, a layer adsorbing impurities, and the like on the surface are removed by sputtering or the like and the cleaned and activated surfaces are brought into contact to be bonded to each other can be used. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

Furthermore, for bonding the insulating layers to each other, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When the layer 561 and the layer 562 are bonded to each other, the insulating layers and the metal layers coexist on their bonding surfaces; therefore, the surface activated bonding method and the hydrophilic bonding method are performed in combination, for example.

For example, a method can be used in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

Figure 16B:
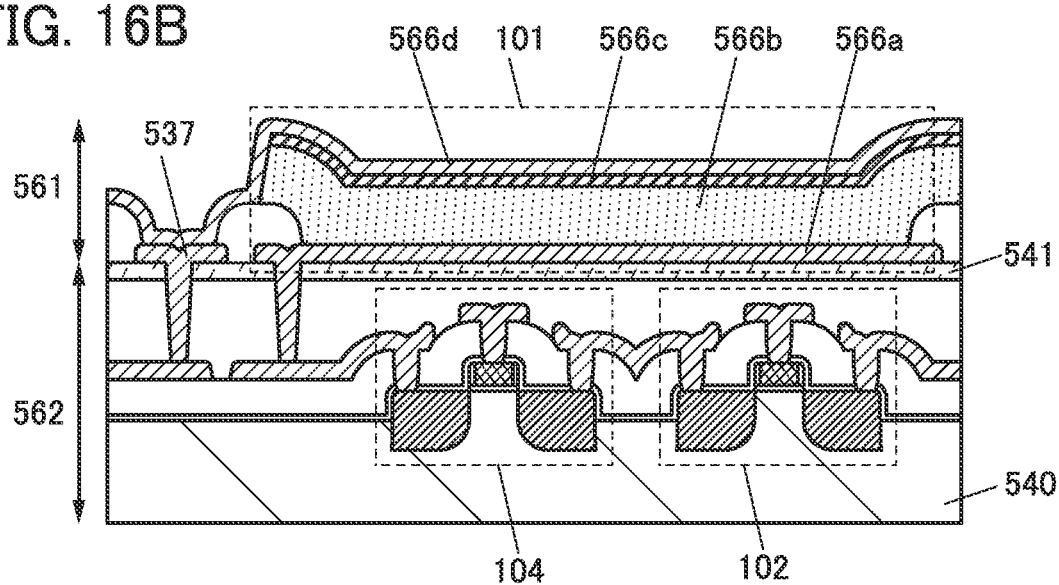

FIG. 16(B) is a cross-sectional view in the case where a pn-junction photodiode in which a selenium-based material is used for a photoelectric conversion layer is used for the layer 561 of the pixel illustrated in FIG. 15(A). The layer 566a is included as one electrode, the layers 566b and 566c are included as a photoelectric conversion layer, and the layer 566d is included as the other electrode.

In this case, the layer 561 can be directly formed on the layer 562. The layer 566a is electrically connected to the source or the drain of the transistor 104. The layer 566d is electrically connected to the power supply line through the conductive layer 537. Note that in the case where an organic optical conductive film is used for the layer 561, the connection mode with the transistor is the same as the above.

Figure 18A:
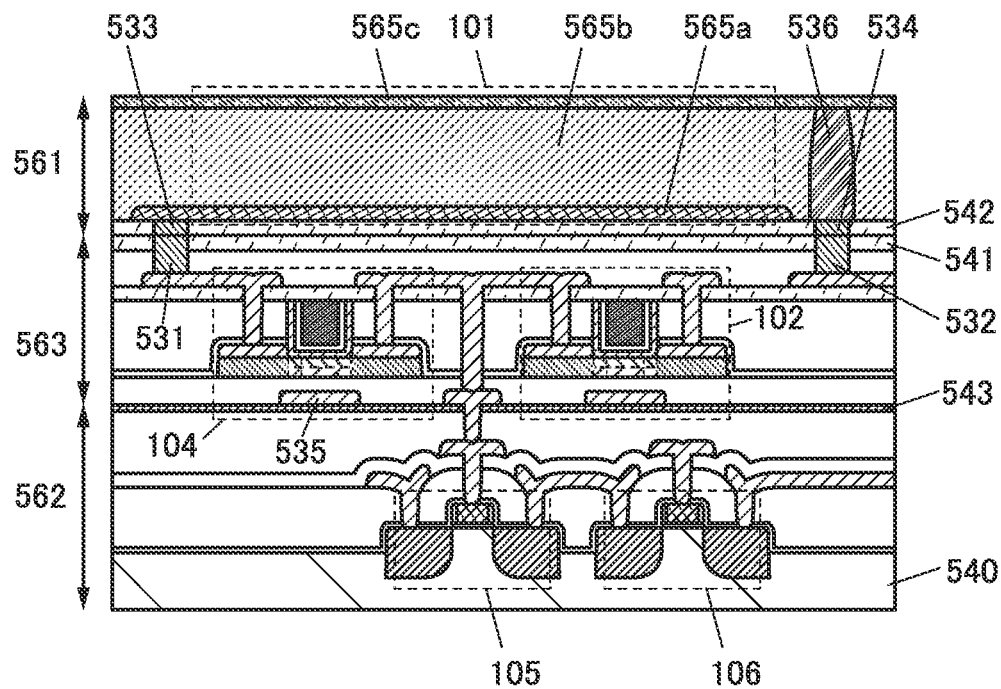
FIGS. 18(A) and 18(B) are diagrams illustrating structures of a pixel in an imaging device.

FIG. 18(A) is a diagram illustrating an example of a cross section of the pixel illustrated in FIG. 15(B). The layer 561 includes a pn-junction photodiode with silicon for a photoelectric conversion layer, as the photoelectric conversion device 101. The layer 562 includes a Si transistor, and FIG. 18(A) illustrates the transistors 105 and 106 included in the pixel circuit, with the use of the pixel 10b as an example. The layer 563 includes an OS transistor, and the transistors 102 and 104 included in the pixel circuit are illustrated as an example. A structure example is illustrated in which electrical connection between the layer 561 and the layer 563 is obtained by bonding.

Figure 19A:
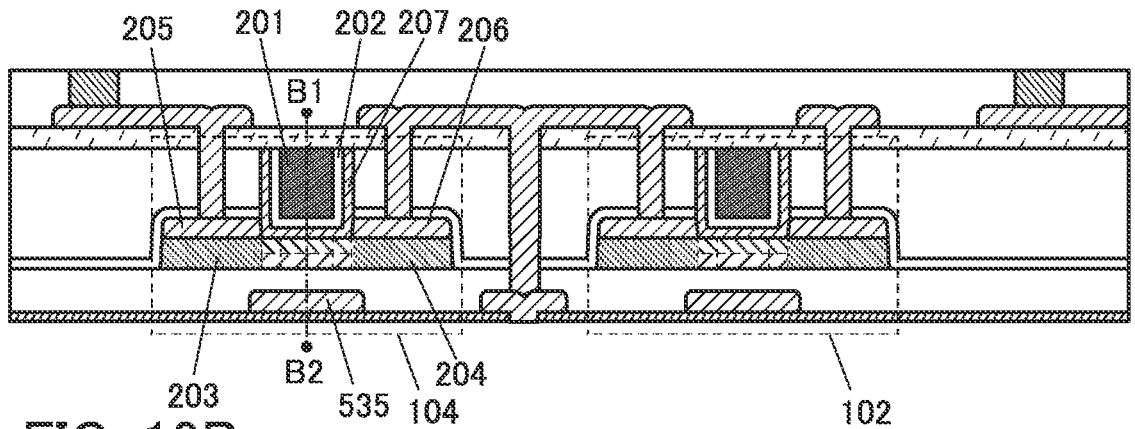
FIGS. 19(A) to 19(D) are diagrams illustrating transistors.

The details of an OS transistor are illustrated in FIG. 19(A). The OS transistor illustrated in FIG. 19(A) has a self-aligned structure in which an insulating layer is provided over a stacked layer of an oxide semiconductor layer and a conductive layer and a groove reaching the oxide semiconductor layer is provided, so that a source electrode 205 and a drain electrode 206 are formed.

The OS transistor can include a gate electrode 201 and a gate insulating film 202 in addition to a channel formation region, a source region 203, and a drain region 204, which are formed in the oxide semiconductor layer. At least the gate insulating film 202 and the gate electrode 201 are provided in the groove. The groove may further be provided with an oxide semiconductor layer 207.

Figure 19B:
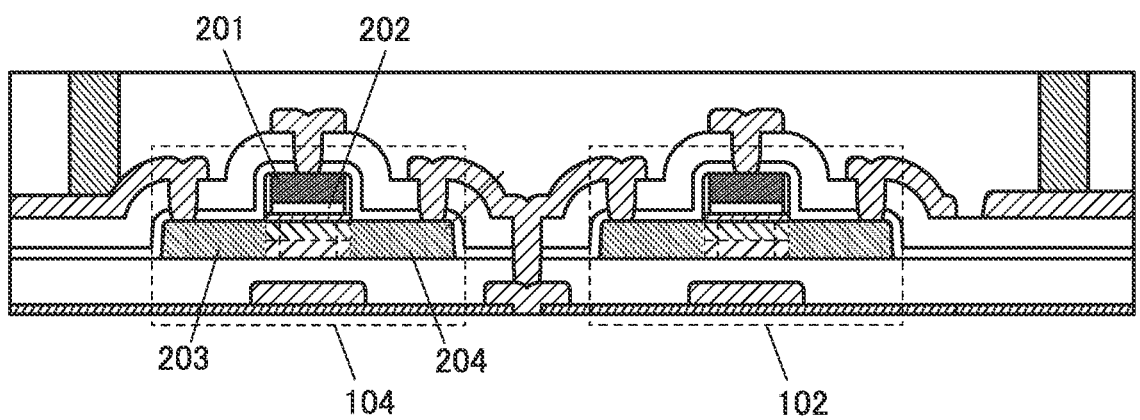

As illustrated in FIG. 19(B), the OS transistor may have a self-aligned structure in which the source region and the drain region are formed in the oxide semiconductor layer with the gate electrode 201 as a mask.

Figure 19C:
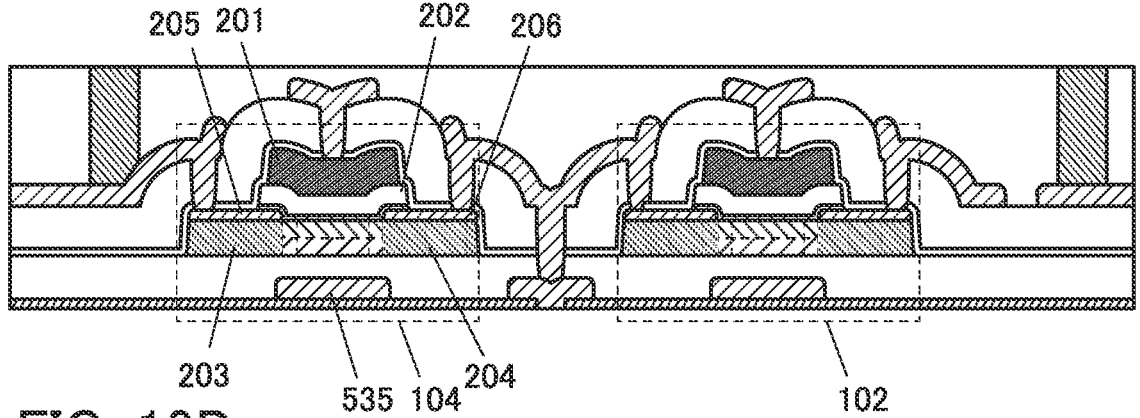

As illustrated in FIG. 19(C), the OS transistor may be a non-self-aligned top-gate transistor including a region where the source electrode 205 or the drain electrode 206 overlaps with the gate electrode 201.

Figure 19D:
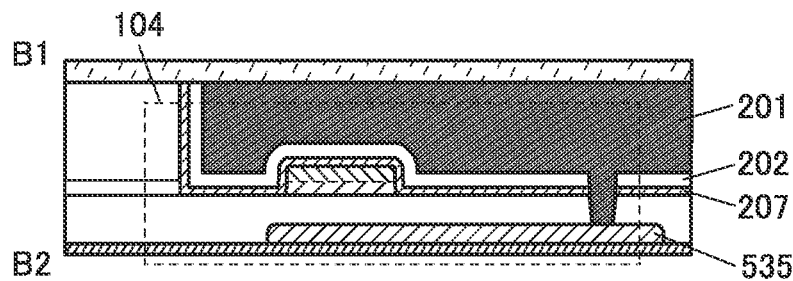

Although the transistors 102 and 104 each have a structure with a back gate 535, they may have a structure without a back gate. As illustrated in the cross-sectional view of the transistor in the channel width direction in FIG. 19(D), the back gate 535 may be electrically connected to a front gate of the transistor, which is provided to face the back gate. Note that FIG. 19(D) illustrates the transistor in FIG. 18(A) as an example; however, the same applies to a transistor having any of the other structures. Different fixed potentials may be supplied to the back gate 535 and the front gate.

An insulating layer 543 that has a function of inhibiting diffusion of hydrogen is provided between a region where OS transistors are formed and a region where Si transistors are formed. Hydrogen in the insulating layer provided in the vicinity of the channel formation region of each of the transistors 105 and 106 terminates a dangling bond of silicon. Meanwhile, hydrogen in the insulating layer provided in the vicinity of the channel formation region of each of the transistors 102 and 104 is a factor of generating a carrier in the oxide semiconductor layer.

Hydrogen is confined in one layer using the insulating layer 543, whereby the reliability of the transistors 105 and 106 can be improved. Furthermore, diffusion of hydrogen from the one layer to the other layer is inhibited, so that the reliability of the transistors 102 and 104 can also be improved.

For the insulating layer 543, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used, for example.

Figure 18B:
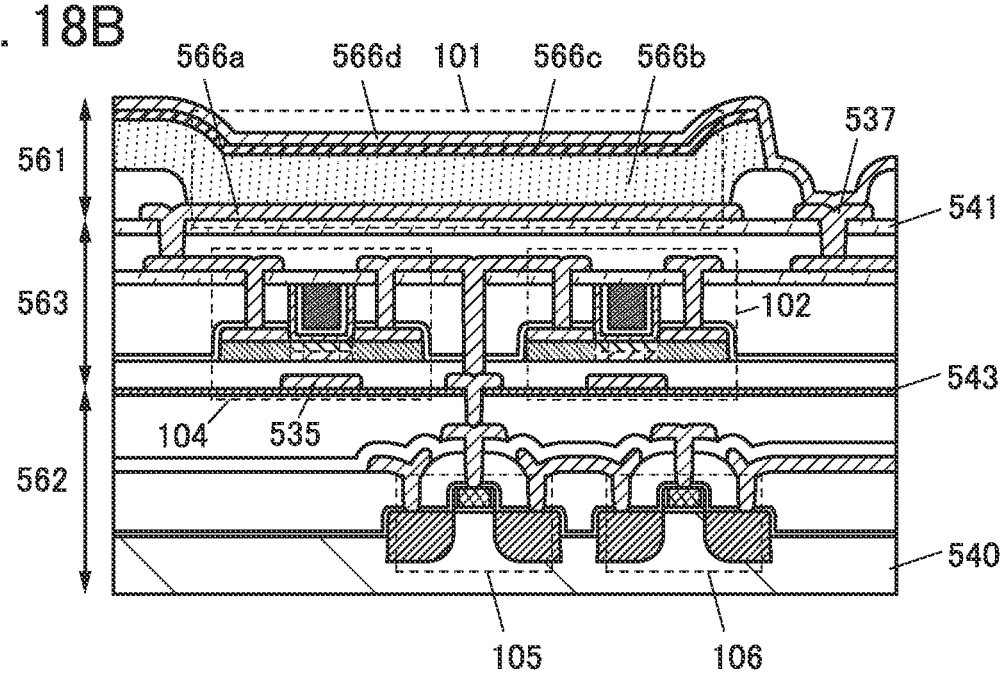

FIG. 18(B) is a cross-sectional view in the case where a pn-junction photodiode in which a selenium-based material is used for a photoelectric conversion layer is used for the layer 561 of the pixel illustrated in FIG. 15(B). The layer 561 can be directly formed on the layer 563. The above description can be referred to for the details of the layers 561, 562, and 563. Note that in the case where an organic optical conductive film is used for the layer 561, the connection mode with the transistor is the same as the above.

Figure 20A:
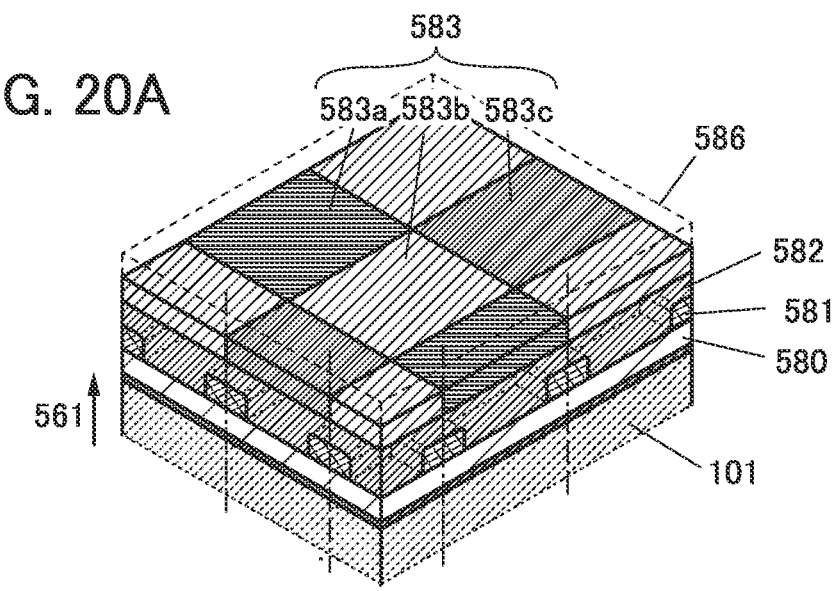
FIGS. 20(A) to 20(C) are diagrams illustrating structures of a pixel in an imaging device.

FIG. 20(A) is a perspective view illustrating an example in which a color filter and the like are added to a pixel of the imaging device of one embodiment of the present invention. The perspective view also illustrates cross sections of a plurality of pixels. An insulating layer 580 is formed over the layer 561 where the photoelectric conversion device 101 is formed. As the insulating layer 580, a silicon oxide film with a high light-transmitting property with respect to visible light can be used, for example. In addition, a silicon nitride film may be stacked as a passivation film. A dielectric film of hafnium oxide or the like may be stacked as an anti-reflection film.

A light-blocking layer 581 may be formed over the insulating layer 580. The light-blocking layer 581 has a function of inhibiting color mixing of light passing through the upper color filter. As the light-blocking layer 581, a metal layer of aluminum, tungsten, or the like can be used. The metal layer and a dielectric film having a function of an anti-reflection film may be stacked.

An organic resin layer 582 can be provided as a planarization film over the insulating layer 580 and the light-blocking layer 581. A color filter 583 (color filters 583a, 583b, and 583c) is formed in each pixel. Color images can be obtained, for example, when colors of R (red), G (green), B (blue), Y (yellow), C (cyan), M (magenta), and the like are assigned to the color filters 583a, 583b, and 583c.

An insulating layer 586 having a light-transmitting property with respect to visible light can be provided over the color filter 583, for example.

Figure 20B:
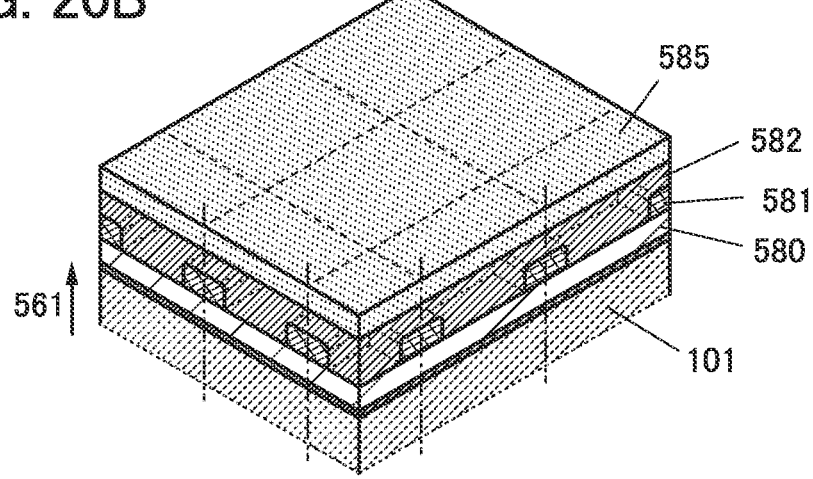

As illustrated in FIG. 20(B), an optical conversion layer 585 may be used instead of the color filter 583. Such a structure enables the imaging device to obtain images in various wavelength regions.

For example, when a filter that blocks light having a wavelength shorter than or equal to that of visible light is used as the optical conversion layer 585, an infrared imaging device can be obtained. When a filter that blocks light having a wavelength shorter than or equal to that of near infrared light is used as the optical conversion layer 585, a far-infrared imaging device can be obtained. When a filter that blocks light having a wavelength longer than or equal to that of visible light is used as the optical conversion layer 585, an ultraviolet imaging device can be obtained.

Furthermore, when a scintillator is used as the optical conversion layer 585, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion device 101 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, a resin or ceramics in which $Gd_2O_2S:Tb$, $Gd_2O_2S:Pr$, $Gd_2O_2S:Eu$, $BaFC_1:Eu$, NaI, CsI, $CaF_2$, $BaF_2$, $CeF_3$, LiF, LiI, ZnO, or the like is dispersed can be used.

In the photoelectric conversion device 101 containing a selenium-based material, radiation such as X-rays can be directly converted into charge; thus, a structure that does not require a scintillator can be employed.

Figure 20C:
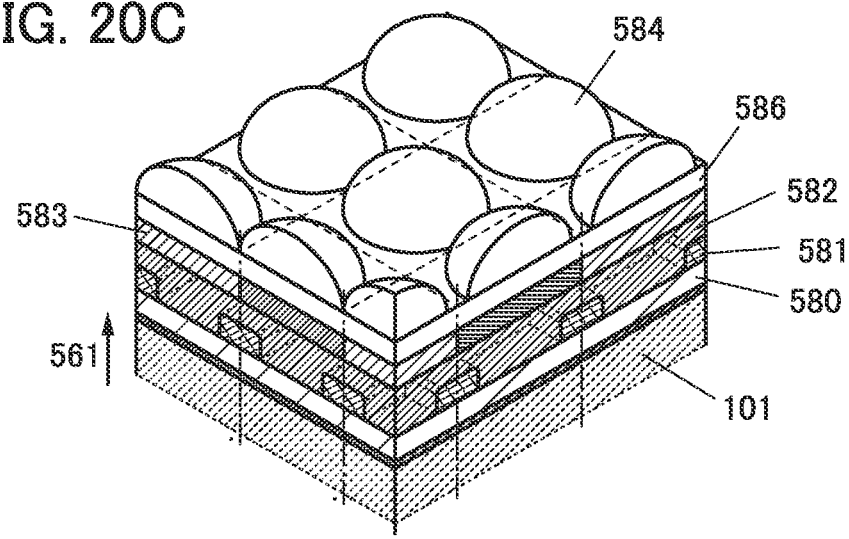

As illustrated in FIG. 20(C), a microlens array 584 may be provided over the color filter 583. Light passing through lenses included in the microlens array 584 goes through the color filter 583 positioned thereunder to irradiate the photoelectric conversion device 101. The microlens array 584 may be provided over the optical conversion layer 585 illustrated in FIG. 20(B).

Examples of a package and a camera module in each of which an image sensor chip is placed will be described below. For the image sensor chip, the structure of the above imaging device can be used.

FIG. 21(A1) is an external perspective view of the top surface side of a package in which an image sensor chip is placed. The package includes a package substrate 410 to which an image sensor chip 450 (see FIG. 21(A3)) is fixed, a cover glass 420, an adhesive 430 for bonding them, and the like.

FIG. 21(A2) is an external perspective view of the bottom surface side of the package. A BGA (Ball grid array) in which solder balls are used as bumps 440 on the bottom surface of the package is employed. Note that, without being limited to the BGA, an LGA (Land grid array), a PGA (Pin Grid Array), or the like may be employed.

FIG. 21(A3) is a perspective view of the package, in which parts of the cover glass 420 and the adhesive 430 are not illustrated. Electrode pads 460 are formed over the package substrate 410, and the electrode pads 460 and the bumps 440 are electrically connected to each other via through-holes. The electrode pads 460 are electrically connected to the image sensor chip 450 through wires 470.

FIG. 21(B1) is an external perspective view of the top surface side of a camera module in which an image sensor chip is placed in a package with a built-in lens. The camera module includes a package substrate 411 to which an image sensor chip 451 is fixed, a lens cover 421, a lens 435, and the like. Furthermore, an IC chip 490 (see FIG. 21(B3)) having a function of a driver circuit, a signal conversion circuit, or the like of an imaging device is provided between the package substrate 411 and the image sensor chip 451 (see FIG. 21(B3)); thus, the structure as an SiP (System in package) is included.

FIG. 21(B2) is an external perspective view of the bottom surface side of the camera module. A QFN (Quad flat no-lead package) structure in which lands 441 for mounting are provided on the bottom surface and side surfaces of the package substrate 411 is employed. Note that this structure is only an example, and a QFP (Quad flat package) or the above-mentioned BGA may also be provided.

FIG. 21(B3) is a perspective view of the module, in which parts of the lens cover 421 and the lens 435 are not illustrated. The lands 441 are electrically connected to electrode pads 461, and the electrode pads 461 are electrically connected to the image sensor chip 451 or the IC chip 490 through wires 471.

The image sensor chip placed in a package having the above form can be easily mounted on a printed substrate or the like, and the image sensor chip can be incorporated into a variety of semiconductor devices and electronic devices.

This embodiment can be combined with the description of other embodiments as appropriate.

Embodiment 3

As electronic devices that can include the imaging device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. Specific examples of these electronic devices are illustrated in FIGS. 22(A) to 22(F).

Figure 22A:
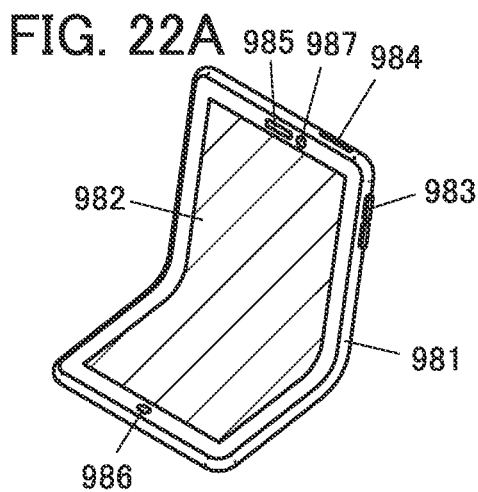
FIGS. 22(A) to 22(F) are diagrams illustrating electronic devices.

FIG. 22(A) is an example of a mobile phone, which includes a housing 981, a display portion 982, an operation button 983, an external connection port 984, a speaker 985, a microphone 986, a camera 987, and the like. The display portion 982 of the mobile phone includes a touch sensor. A variety of operations such as making a call and inputting text can be performed by touch on the display portion 982 with a finger, a stylus, or the like. The imaging device of one embodiment of the present invention can be used as a component for image capturing in the mobile phone.

Figure 22B:
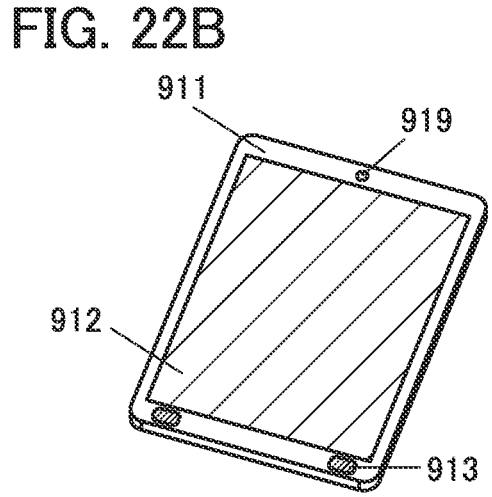

FIG. 22(B) is a portable data terminal, which includes a housing 911, a display portion 912, a speaker 913, a camera 919, and the like. A touch panel function of the display portion 912 enables input and output of information. Furthermore, a character or the like in an image that is captured by the camera 919 can be recognized and the character can be voice-output from the speaker 913. The imaging device of one embodiment of the present invention can be used as a component for image capturing in the portable data terminal.

Figure 22C:
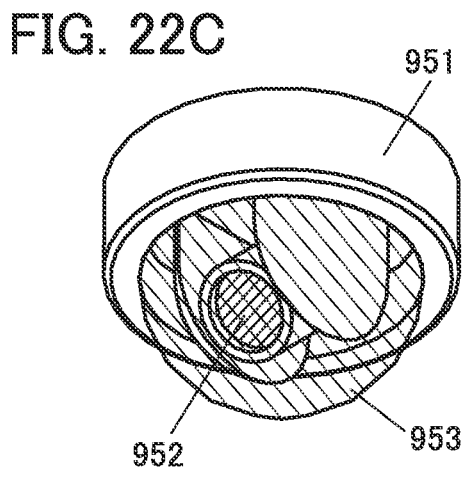

FIG. 22(C) is a surveillance camera, which includes a support base 951, a camera unit 952, a protection cover 953, and the like. By providing the camera unit 952 provided with a rotating mechanism and the like on a ceiling, an image of the entire circumstance can be taken. The imaging device of one embodiment of the present invention can be used as a component for image capturing in the camera unit. Note that a surveillance camera is a name in common use and does not limit the use thereof. A device that has a function of a surveillance camera can also be called a camera or a video camera, for example.

Figure 22D:
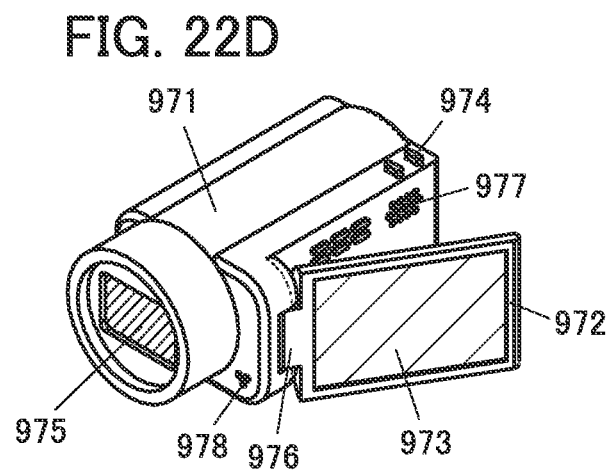

FIG. 22(D) is a video camera, which includes a first housing 971, a second housing 972, a display portion 973, an operation key 974, a lens 975, a connection portion 976, a speaker 977, a microphone 978, and the like. The operation key 974 and the lens 975 are provided on the first housing 971, and the display portion 973 is provided on the second housing 972. The imaging device of one embodiment of the present invention can be used as a component for image capturing in the video camera.

Figure 22E:
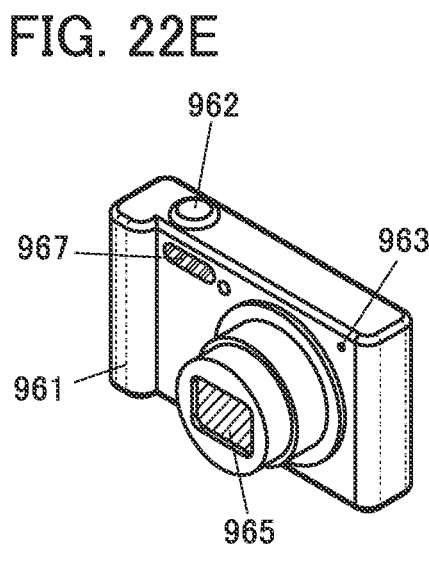

FIG. 22(E) is a digital camera, which includes a housing 961, a shutter button 962, a microphone 963, a light-emitting portion 967, a lens 965, and the like. The imaging device of one embodiment of the present invention can be used as a component for image capturing in the digital camera.

Figure 22F:
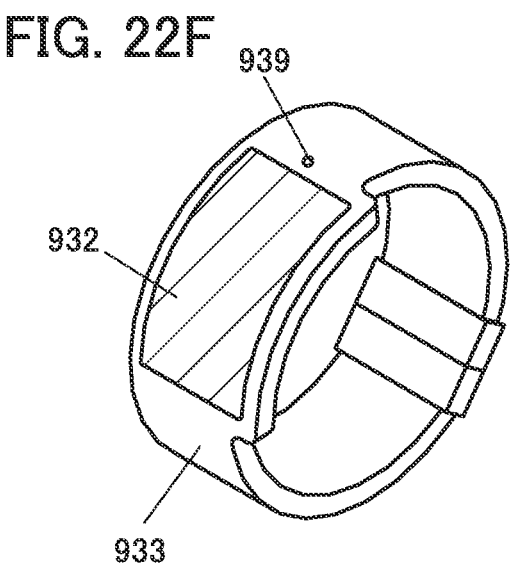

FIG. 22(F) is a wrist-watch-type information terminal, which includes a display portion 932, a housing and wristband 933, a camera 939, and the like. The display portion 932 is provided with a touch panel for performing the operation of the information terminal. The display portion 932 and the housing and wristband 933 have flexibility and fit a body well. The imaging device of one embodiment of the present invention can be used as a component for image capturing in the information terminal.

This embodiment can be combined with the description of other embodiments as appropriate.

REFERENCE NUMERALS

10: pixel, 10a: pixel, 10b: pixel, 10c: pixel, 11: circuit, 12: circuit, 21: pixel array, 22: circuit, 23: circuit, 24: circuit, 25: circuit, 26: circuit, 28: circuit, 101: photoelectric conversion device, 102: transistor, 103: transistor, 104: transistor, 105: transistor, 106: transistor, 107: capacitor, 108: capacitor, 109: capacitor, 110: transistor, 111: transistor, 121: wiring, 122: wiring, 123: wiring, 124: wiring, 125: wiring, 126: wiring, 127: wiring, 128: wiring, 129: wiring, 130: wiring, 131: wiring, 201: gate electrode, 202: gate insulating film, 203: source region, 204: drain region, 205: source electrode, 206: drain electrode, 207: oxide semiconductor layer, 410: package substrate, 411: package substrate, 420: cover glass, 421: lens cover, 430: adhesive, 435: lens, 440: bump, 441: land, 450: image sensor chip, 451: image sensor chip, 460: electrode pad, 461: electrode pad, 470: wire, 471: wire, 490: IC chip, 531: conductive layer, 532: conductive layer, 533: conductive layer, 534: conductive layer, 535: back gate, 536: region, 537: conductive layer, 540: silicon substrate, 541: insulating layer, 542: insulating layer, 543: insulating layer, 545: semiconductor layer, 546: insulating layer, 561: layer, 562: layer, 563: layer, 565a: layer, 565b: layer, 565c: layer, 566a: layer, 566b: layer, 566c: layer, 566d: layer, 567a: layer, 567b: layer, 567c: layer, 567d: layer, 567e: layer, 580: insulating layer, 581: light-blocking layer, 582: organic resin layer, 583: color filter, 583a: color filter, 583b: color filter, 583c: color filter, 584: microlens array, 585: optical conversion layer, 586: insulating layer, 911: housing, 912: display portion, 913: speaker, 919: camera, 932: display portion, 933: housing and wristband, 939: camera, 951: support base, 952: camera unit, 953: protection cover, 961: housing, 962: shutter button, 963: microphone, 965: lens, 967: light-emitting portion, 971: housing, 972: housing, 973: display portion, 974: operation key, 975: lens, 976: joint, 977: speaker, 978: microphone, 981: housing, 982: display portion, 983: operation button, 984: external connection port, 985: speaker, 986: microphone, 987: camera

The invention claimed is:

1. An imaging device comprising:
a pixel comprising a first circuit and a second circuit,
wherein the first circuit comprises a first transistor, a second transistor, and a first capacitor,
wherein one of a source and a drain of the first transistor is electrically connected to one electrode of the first capacitor,
wherein the other electrode of the first capacitor is electrically connected to one of a source and a drain of the second transistor,
wherein the one of the source and the drain of the first transistor is electrically connected to the second circuit, and
wherein the second circuit comprises a photoelectric conversion device.

2. The imaging device according to claim 1,
wherein the first circuit has a function of adding a first potential and a second potential to generate a third potential, and
wherein the second circuit has a function of generating data in the photoelectric conversion device to which the third potential is applied and a function of outputting the data.

3. The imaging device according to claim 1,
wherein the second circuit further comprises a third transistor, a fourth transistor, a fifth transistor, and a second capacitor,
wherein one electrode of the photoelectric conversion device is electrically connected to one of a source and a drain of the third transistor,
wherein the other of the source and the drain of the third transistor is electrically connected to one electrode of the second capacitor,
wherein the one electrode of the second capacitor is electrically connected to a gate of the fourth transistor, and
wherein one of a source and a drain of the fourth transistor is electrically connected to one of a source and a drain of the fifth transistor.

4. The imaging device according to claim 3,
wherein the one of the source and the drain of the third transistor is electrically connected to the first circuit.

5. The imaging device according to claim 3,
wherein the other of the source and the drain of the third transistor is electrically connected to the first circuit.

6. The imaging device according to claim 1,
wherein the second circuit further comprises a third transistor, a fourth transistor, a fifth transistor, and a second capacitor,
wherein one electrode of the photoelectric conversion device is electrically connected to one electrode of the second capacitor,
wherein the one electrode of the second capacitor is electrically connected to a gate of the fourth transistor,
wherein one of a source and a drain of the fourth transistor is electrically connected to one of a source and a drain of the fifth transistor,
wherein the other electrode of the photoelectric conversion device is electrically connected to one of a source and a drain of the third transistor, and
wherein the one electrode of the photoelectric conversion device is electrically connected to the first circuit.

7. The imaging device according to claim 3,
wherein at least one of the first to fifth transistors comprises a metal oxide in a channel formation region, and the metal oxide comprises In, Zn, and M (M is Al, Ti, Ga, Sn, Y, Zr, La, Ce, Nd, or Hf).

8. The imaging device according to claim 1,
wherein the photoelectric conversion device is an avalanche photodiode.

9. An electronic device comprising:
the imaging device according to claim 1; and
a speaker.

10. An imaging device comprising:
a pixel comprising a first circuit and a second circuit,
wherein the second circuit comprises a photoelectric conversion device, a third transistor, a fourth transistor, a fifth transistor, and a capacitor,
wherein the first circuit is electrically connected to the second circuit,
wherein one electrode of the photoelectric conversion device is electrically connected to one of a source and a drain of the third transistor, wherein the other of the source and the drain of the third transistor is electrically connected to one electrode of the capacitor, wherein the one electrode of the capacitor is electrically connected to a gate of the fourth transistor, wherein one of a source and a drain of the fourth transistor is electrically connected to one of a source and a drain of the fifth transistor, wherein the first circuit has a function of adding a first potential and a second potential to generate a third potential, and wherein the second circuit has a function of generating data in the photoelectric conversion device to which the third potential is applied and a function of outputting the data.

11. The imaging device according to claim 10, wherein the one of the source and the drain of the third transistor is electrically connected to the first circuit.

12. The imaging device according to claim 10, wherein the other of the source and the drain of the third transistor is electrically connected to the first circuit.

13. An imaging device comprising:
a pixel comprising a first circuit and a second circuit,
wherein the second circuit comprises a photoelectric conversion device, a third transistor, a fourth transistor, a fifth transistor, and a capacitor, wherein one electrode of the photoelectric conversion device is electrically connected to one electrode of the capacitor, wherein the one electrode of the capacitor is electrically connected to a gate of the fourth transistor, wherein one of a source and a drain of the fourth transistor is electrically connected to one of a source and a drain of the fifth transistor, wherein the other electrode of the photoelectric conversion device is electrically connected to one of a source and a drain of the third transistor, wherein the one electrode of the photoelectric conversion device is electrically connected to the first circuit, wherein the first circuit has a function of adding a first potential and a second potential to generate a third potential, and wherein the second circuit has a function of generating data in the photoelectric conversion device to which the third potential is applied and a function of outputting the data.

* * * * *